(12) United States Patent
Tohya et al.

(10) Patent No.: US 7,315,226 B2
(45) Date of Patent: Jan. 1, 2008

(54) STRIP LINE DEVICE, PRINTED WIRING BOARD MOUNTING MEMBER, CIRCUIT BOARD, SEMICONDUCTOR PACKAGE, AND METHOD OF FORMING SAME

(75) Inventors: Hirokazu Tohya, Tokyo (JP); Koichiro Masuda, Tokyo (JP); Hideki Shimizu, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 10/526,673

(22) PCT Filed: Sep. 2, 2003

(86) PCT No.: PCT/JP03/11209

§ 371 (c)(1),
(2), (4) Date: Mar. 4, 2005

(87) PCT Pub. No.: WO2004/023597

PCT Pub. Date: Mar. 18, 2004

(65) Prior Publication Data

US 2006/0164189 A1    Jul. 27, 2006

(30) Foreign Application Priority Data

Sep. 4, 2002  (JP) .............................. 2002-259309
Feb. 21, 2003  (JP) .............................. 2003-045089

(51) Int. Cl.
*H03H 7/00*   (2006.01)

(52) U.S. Cl. ...................................... 333/182; 333/185

(58) Field of Classification Search ................ 333/134, 333/182, 184, 185, 262
See application file for complete search history.

(56) References Cited

U.S. PATENT DOCUMENTS 5,500,629 A * 3/1996 Meyer ......................... 333/181
6,191,933 B1  2/2001 Ishigaki et al.

(Continued)

FOREIGN PATENT DOCUMENTS

GB            2393334 A   *  3/2004

(Continued)

OTHER PUBLICATIONS

Microfilm of the specificaiton and drawings annexed to the request of Japanese Utility Model Application No. 26649/1983 (Laid-open No. 132629/1984) (NEC Corp.), Sep. 05, 1984, p. 2, lines 10 to 16; Fig. 1 (Family: none).

*Primary Examiner*—Robert Pascal
*Assistant Examiner*—Kimberly E Glenn
(74) *Attorney, Agent, or Firm*—Young & Thompson

(57) ABSTRACT

Electromagnetic waves leaking from a power distribution circuit provided on a printed wiring substrate or in a semiconductor package are suppressed, and degradation of the waveform of a signal generated by a high-speed digital circuit. A strip line device comprises an elongated metal plate (10) having a valve action and coated with a dielectric film (20). A conductive layer (30) is formed to cover the valve-acting metal, with the dielectric film (20) interposed therebetween. The characteristic impedance as seen from its input terminal can be low over a wide range.

21 Claims, 38 Drawing Sheets

U.S. PATENT DOCUMENTS

| | | |
|---|---|---|
| 6,365,828 B1 | 4/2002 | Kinoshita et al. |
| 6,392,869 B2 | 5/2002 | Shiraishi et al. |
| 6,646,523 B2 * | 11/2003 | Arai et al. ................... 333/184 |
| 6,721,171 B2 * | 4/2004 | Masuda et al. ............. 361/523 |
| 6,836,195 B2 * | 12/2004 | Arai et al. ................... 333/182 |
| 6,873,518 B2 * | 3/2005 | Masuda et al. ............. 361/525 |
| 6,911,880 B2 * | 6/2005 | Arai et al. ................... 333/181 |
| 7,005,944 B2 * | 2/2006 | Arai et al. ................... 333/185 |

FOREIGN PATENT DOCUMENTS

| | | |
|---|---|---|
| JP | 3-35516 | 2/1991 |
| JP | 3-167816 | 7/1991 |
| JP | 4-56445 | 9/1992 |
| JP | 6-53046 | 2/1994 |
| JP | 10-50554 | 2/1997 |
| JP | 9-134618 | 5/1997 |
| JP | 10-108361 | 4/1998 |
| JP | 11-219847 | 8/1999 |
| JP | 2000-150304 | 5/2000 |
| JP | 2001-53449 | 2/2001 |
| JP | 2001-119154 | 4/2001 |
| JP | 2001-223140 | 8/2001 |
| JP | 2002-164760 | 6/2002 |
| JP | 2002-184651 | 6/2002 |
| JP | 2002-335107 | 11/2002 |
| JP | 2003-101311 | 4/2003 |
| JP | 2003-124066 | 4/2003 |

* cited by examiner

FIG. 20
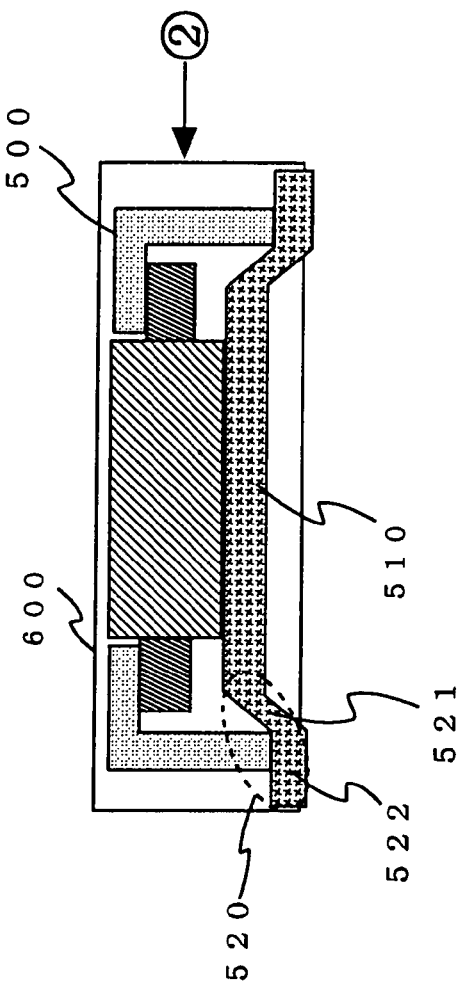
(A)
SIDE VIEW FROM ① DIRECTION
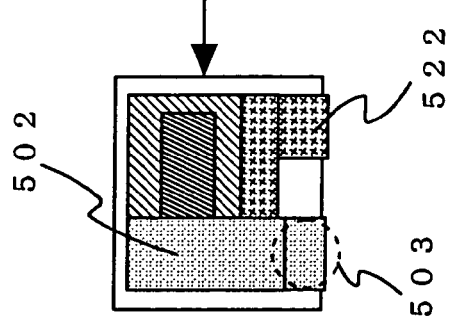
(B)
SIDE VIEW FROM ② DIRECTION FIG. 23
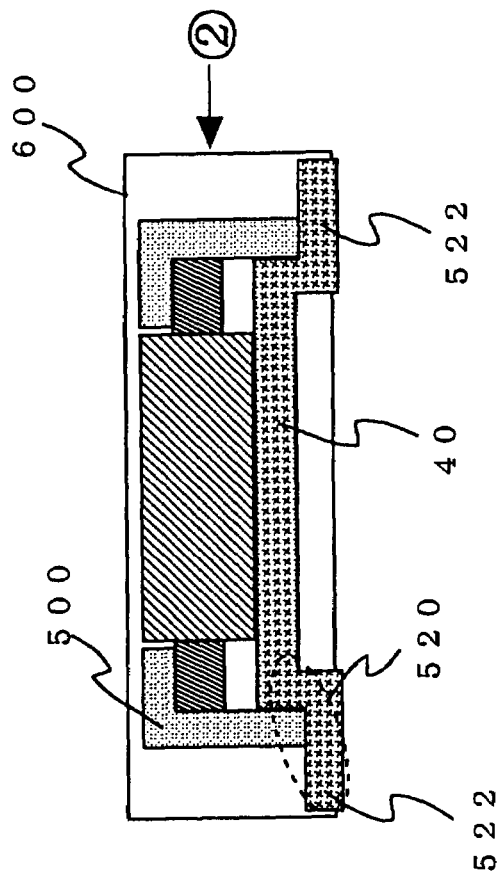
(A)
SIDE VIEW FROM ① DIRECTION
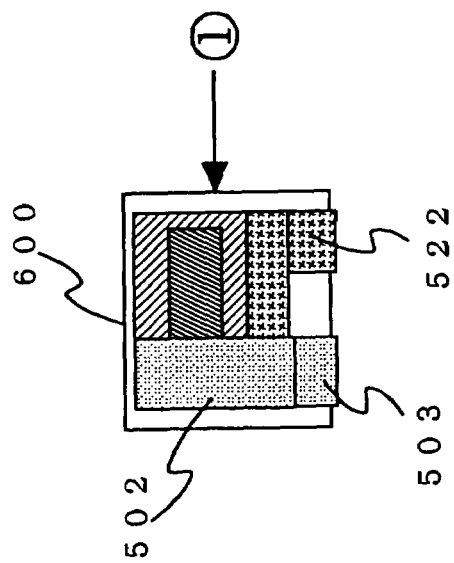
(B)
SIDE VIEW FROM ② DIRECTION FIG.31
(A)
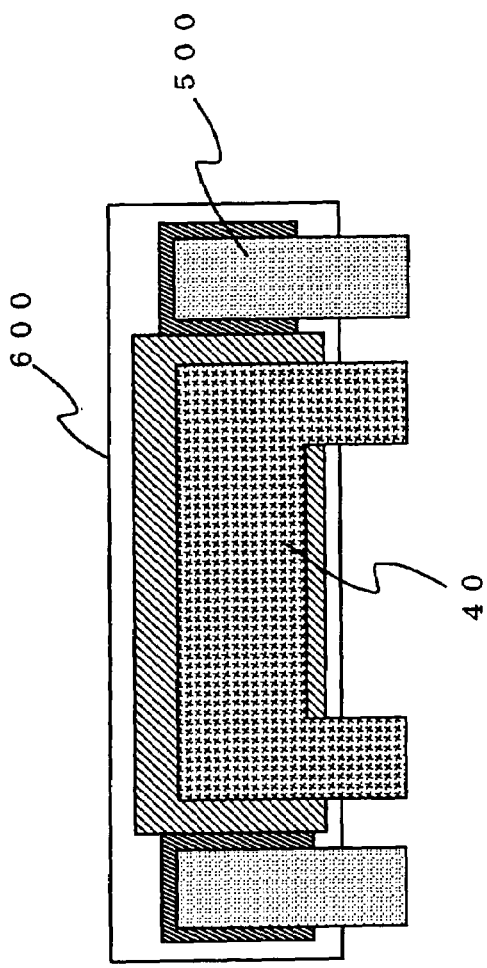
SIDE VIEW FROM ① DIRECTION
(B)
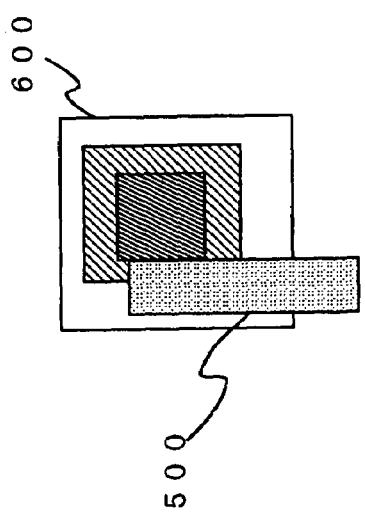
SIDE VIEW FROM ② DIRECTION

STRIP LINE DEVICE, PRINTED WIRING BOARD MOUNTING MEMBER, CIRCUIT BOARD, SEMICONDUCTOR PACKAGE, AND METHOD OF FORMING SAME

TECHNICAL FIELD

The present invention relates a technique for suppressing electromagnetic waves leaking through a power distribution circuit provided on a printed wiring board or a semiconductor package and preventing degradation of the waveform of a signal excited by a high-speed digital circuit, and particularly to a stripline device which is connected between a high-speed digital circuit and a power distribution circuit, reduces a characteristic impedance on the side of the power distribution circuit over a wide frequency band as viewed from the high-speed digital circuit to suppress the leakage of electromagnetic waves, and is suitable for preventing degradation of the waveform of a signal excited by the high-speed digital circuit, a circuit board using the device, a semiconductor package, and a method of forming the stripline device.

BACKGROUND ART

In recent years, starting with mobile phones, there has been a considerable demand for compact and high-speed electronic devices. This demand is satisfied by, e.g., increasing the speed of a clock signal in switching power supplies and the components of digital signal processing circuits. Accordingly, a high-frequency current increases in circuits, particularly in power supply circuits, so that an electromagnetic radiation increases and signal quality degrades in a considerable manner. Hence, there has been an increasingly vocal demand for higher performance of devices for decoupling power.

Since high-performance digital devices include high-speed circuits operating at high speed and low-speed circuits operating at low speed, the spectrum of electromagnetic waves leaking into a power distribution circuit is recently distributed over an extremely wide band of several hundreds kHz to several tens GHz. The current of a direct-current power supply of a semiconductor integrated circuit, which is relatively large and is mounted on a circuit board, reaches a high level exceeding several tens amperes. As shown in FIG. 1, the power distribution circuit is a circuit including a power supply circuit and a power distribution wire for supplying, to another circuit, power having been supplied from the power supply circuit.

Leaked electromagnetic waves propagate through the power distribution wire and other circuits to the power supply circuit and cause a failure on a circuit fed with power from the power supply circuit. In general, a number of signal wires are disposed around the power distribution wire of the board. Thus, leaked electromagnetic waves are readily coupled to a number of signal wires. The leaked electromagnetic waves having been coupled to the signal wires degrade signal quality and propagate as high-frequency current through the signal wires to an external signal cable of a digital device. Then, the external signal cable acts as an antenna to radiate unwanted electromagnetic waves at high level to the air.

Further, some of the leaked electromagnetic waves propagating through the power distribution wire pass through the power supply circuit and propagate through a commercial AC power supply line. The commercial AC power supply line acts as an antenna to radiate unwanted electromagnetic waves at high level to the air. Meanwhile, the leaked electromagnetic waves propagate through the power distribution wire while repeating reflection at some midpoint in the power distribution wire. Thus, some of the leaked electromagnetic waves also propagate through the signal wire and degrade the waveform of a signal.

As shown in FIG. 1, a drastic measure for solving the above problem is to prevent electromagnetic waves generated by circuit operations (e.g., a switching operation of a switching element) from leaking into the power distribution wire. In order to solve the problem, it is necessary to considerably reduce an impedance relative to a high frequency in all frequency bands included in electromagnetic waves when viewing the power distribution circuit from a circuit for generating the electromagnetic waves.

When the impedance of the power distribution circuit viewed from a transistor becomes closer and closer to 0, electromagnetic waves excited by the transistor reflect on the entrance of the power distribution wire and do not enter the power distribution circuit.

Conventionally, capacitors are used to reduce the impedances of power distribution wires. As components used for electric and electromagnetic devices, capacitors have a long history and various kinds have been put into practical use so far. At present, capacitors such as ceramic capacitors and solid electrolytic capacitors are developed. In the ceramic capacitors, a ceramic material deposited with a metal thin film is laminated in multiple layers. In the solid electrolytic capacitors, a porous compact of a metal such as tantalum and aluminum with a valve action is used as an anode, an oxide film is used as a dielectric, and a conducting polymer is used as a solid electrolyte.

As a solid electrolytic capacitor, the following is known: a solid electrolytic capacitor having polypyrrole or an alkyl substitute thereof as a solid electrolyte on a dielectric oxide film (e.g., Patent Document 1), or a solid electrolytic capacitor having polyaniline formed as a solid electrolyte on a dielectric oxide film and a method of manufacturing the same (e.g., Patent Document 2). As compared with conventional capacitors, conducting polymers higher in conductivity by two digits or more are used as solid electrolytes and thus these capacitors have a low equivalent series resistance. With the same capacitance, these capacitors can exert effects in a high frequency area which is larger by two digits or more than those of the conventional capacitors.

However, these capacitors have two-terminal structures for a charging/discharging function, so that these capacitors rapidly increase an impedance between terminals of a high frequency area exceeding 10 MHz. Thus, these capacitors have become unsuitable for the power distribution circuits of digital circuits. For this reason, multilayer feedthrough capacitors and capacitor arrays for connecting a number of small multilayer ceramic capacitor chips in parallel have been developed. However, it has been difficult to efficiently reduce an impedance in a high frequency area exceeding 10 MHz.

To handle higher frequencies, the configurations of filters have been also studied. For example, a surface-mount noise filter has been proposed which is composed of a meandering conductor and a ground conductor which are interposed between ceramic dielectric sheets (e.g., Patent Document 3). FIG. 2 is a sectional view showing the configuration of the surface-mount noise filter composed of the meandering conductor and the ground conductor which are interposed between the ceramic dielectric sheets.

As shown in FIG. 2, the conventional surface-mount filter is configured such that a first dielectric sheet 110, a second dielectric sheet 120, and a third dielectric sheet 130 are laminated. A first internal conductor 111, a meandering conductor 115, and a second internal conductor 112, which are used for transmitting a signal, are disposed on an interface between the first dielectric sheet 110 and the second dielectric sheet 120. A ground conductor 125 is formed on an interface between the second dielectric sheet 120 and the third dielectric sheet 130 so as to face the meandering conductor 115.

An end of the first internal conductor 111 is connected to a first signal electrode 151, an end of the second internal conductor 112 is connected to a second signal electrode 152, and the meandering conductor 115 is connected between the other ends of the first internal conductor 111 and the second internal conductor 112. With this configuration, it is possible to obtain a noise filter which is superior in noise absorbing property at high frequencies to a noise filter having a combination of a conventional inductance element and capacitance element.

In such a surface-mount filter, an electric signal inputted from one of the electrodes, e.g., the first signal electrode 115 is filtered and the filtered electric signal is outputted to the other (second signal electrode 152). However, in the surface-mount filter, a capacitance formed as a distributed constant is constituted of the ground conductor 125, the meandering conductor 115, and the dielectric sheets laminated between the conductors. Only with the distribution capacitance, it is difficult to efficiently reduce an impedance in a high frequency area exceeding 10 MHz. Hence, a part of the internal conductor is used as a meandering conductor, so that a capacitance and a series inductance are combined to enhance the effect of attenuating signals.

Further, in order to bring an impedance of a power distribution circuit closer and closer to 0 as viewed from a switching element such as a transistor, the following has been disclosed: a technique using a power distribution circuit as a low impedance line (e.g., Patent Document 4) and a technique for forming a low impedance line by using a technique for manufacturing a solid electrolytic capacitor (e.g., Patent Document 5).

A multilayer printed board disclosed in Patent Document 4 is configured as below:

The multilayer printed board is characterized in that ground layers are laminated respectively via insulating material layers on the upper and lower sides of a power supply layer having a power supply wire. Further, a signal layer having a signal wire is laminated via a second insulating material layer on one or both of the upper and lower ground layers. With this configuration, direct-current power can be supplied to circuit elements such as a semiconductor IC and an LSI mounted on a multilayer printed board as in the case where an independent power supply of a low impedance is provided separately. Moreover, it is possible to suppress the radiation of electromagnetic waves from electronic devices without interfering with high-speed and high-frequency operations of the circuit elements such as an IC and an LSI mounted on the printed board.

A transmission line component disclosed in Patent Document 5 is configured such that a cylindrical external conductor, which is made of a conductive material larger in diameter than an internal conductor, is coaxially disposed via a high permittivity insulating material so as to cover a surface of the internal conductor made of a conductive material, so that a coaxial line of an extremely low characteristic impedance is formed. The component is inserted in series between a power supply line of a printed circuit board and a power supply port of a high-speed radio frequency circuit element such as an LSI, so that direct-current power can be supplied as in the case where an independent power supply of a low impedance is provided separately for each high-speed radio frequency circuit element mounted on the printed circuit board. Additionally, high-frequency power supply current generated from the high-speed radio circuit element by a high-speed switching operation is caused to have a dielectric loss in the transmission line component, so that it is possible to suppress power supply coupling between a power supply line and a signal line and the flow of high-frequency power supply current from the power supply line of the printed circuit board to a power supply cable in an apparatus.

[Patent Document 1]
Japanese Patent Publication No. 4-56445 (Japanese Patent Laid-Open No. 60-37114)
[Patent Document 2]
Japanese Patent Laid-Open No. 3-35516
[Patent Document 3]
Japanese Patent Laid-Open No. 6-53046
[Patent Document 4]
Japanese Patent Laid-Open No. 2001-53449
[Patent Document 5]
Japanese Patent Laid-Open No. 2002-335107

Problems That the Invention is to Solve

As described above, capacitors such as ceramic capacitors and solid electrolytic capacitors have been developed. In the ceramic capacitors, a ceramic material deposited with a metal thin film is laminated in multiple layers. In the solid electrolytic capacitors, a porous compact of a metal such as tantalum and aluminum with a valve action is used as an anode, an oxide film is used as a dielectric, and a conducting polymer is used as a solid electrolyte. These capacitors are used for various purposes as capacitors usable in a high frequency area. However, these capacitors are not considered as line devices in view of the transmission of electromagnetic waves and have two-terminal structures simply for obtaining the charging/discharging function. Thus, an impedance rapidly increases in a high frequency area exceeding 10 MHz.

Hence, in operations at a clock frequency exceeding several hundreds MHz, as long as the capacitors with such a function are used, it is not possible to sufficiently reduce a characteristic presumed to appear in a signal generator circuit, that is, an internal impedance of a power supply at a high frequency.

Although surface-mount filters are have been developed to remove noise, it is difficult to sufficiently reduce an impedance. Thus, the use of the surface-mount capacitor as a substitute is limited. Particularly in a high frequency area of 100 MHz or higher, a low impedance is hard to obtain.

The present invention is devised in view of the above-described circumstances. An object of the present invention is to provide a stripline device which is mainly used as a bypass device of a noise filter and a decoupling device and is suitable for a higher speed and a higher frequency, a printed wiring board integrated with the stripline device, and a semiconductor package.

DISCLOSURE OF THE INVENTION

In order to attain the object, the invention of claim 1 is characterized in that the invention has a metal which has a valve action, a dielectric coating formed on a surface of the metal having the valve action, and a conductive material layer formed around the metal having the valve action via the dielectric coating, a pair of first electrode leading terminals is provided on both ends in the longitudinal direction of the metal to make connection to through holes of a printed wiring board and a pair of second electrode leading terminals is provided on different positions of the metal member to make connection to through holes of the printed wiring board.

It is preferable to form the metal having the valve action into a rectangular, a circle or oval, a ring, or a plate or foil in cross section.

It is preferable to bend or curve both ends of a stripline device.

It is preferable for the metal having the valve action to have a longitudinal width larger than a cross sectional width.

It is preferable that the electrode leading terminal in contact with the printed wiring board have an area larger than a cross sectional area of the electrode leading terminal not coming into contact with the printed wiring board.

According to a second aspect of the present invention, a stripline device has a metal which has a valve action, a dielectric coating formed on a surface of the metal, a conductive material layer formed around the metal via the dielectric coating, and a metal member which is disposed in contact with the conductive material layer and transmits direct-current power.

It is preferable that the stripline device comprise a first electrode leading terminal for connecting an end of the metal having the valve action and a printed wiring board, second electrode leading terminals connected to the printed wiring board be integrally formed on the metal member, and the second electrode leading terminals and the first electrode leading terminals connected to both ends of the metal having the valve action form four terminals.

Further, it is preferable that the first electrode leading terminal have a connecting member connected to the metal having the valve action, a first leg member connected to a wire on the printed wiring board, and a first body member for connecting the connecting member and the leg member, the connecting member and the first leg member be connected almost perpendicularly to both ends in the longitudinal direction of the first body member, the second electrode leading terminal integrally formed on the metal member have a second body member and a second leg member for making connection to a wire on the printed wiring board, the second body members be connected to an upper end of the same mounting surface of both ends in the longitudinal direction of the metal member, and the second leg member be connected to the body member almost in parallel with the mounting surface.

Moreover, according to the second aspect of the present invention, it is preferable that the first electrode leading terminal have a connecting member connected to the metal having the valve action, a first leg member connected to a wire on the printed wiring board, and a first body member for connecting the connecting member and the leg member, a member be provided to interpose the first body member between the connecting member connected to the first body member and the first leg member on both ends in the longitudinal direction of the first body member and connect the connecting member and the first leg member almost perpendicularly to the first body member, and the second electrode leading terminals have second leg members connected to both ends in the longitudinal direction of the metal member and near one of the long sides of the metal member almost in parallel with the mounting surface, and it is preferable that the first electrode terminal have a connecting member connected to the metal having the valve action and a first body member connected to a wire on the printed wiring board, the connecting member be connected to an end in the longitudinal direction of the first body member almost perpendicularly to the first body member, and the second electrode leading terminal have a second body member connected almost perpendicularly to the vicinity of one of the long sides of both ends in the longitudinal direction of the metal member.

It is preferable that the first electrode leading terminal have a connecting member connected to the metal having the valve action and a first body member connected to a wire on the printed wiring board, the connecting member be connected to an end in the longitudinal direction of the first body member almost perpendicularly to the first body member, and the second electrode leading terminal have a second body member connected almost perpendicularly to a central area near both ends in the longitudinal direction of a mounting surface of the metal member, and the first electrode leading terminal and the second electrode leading terminal be disposed almost in line with each other in the longitudinal direction of the mounting surface.

Particularly, in the second aspect, it is preferable that the first leg member and the second leg member be larger in cross sectional area than the first body member and the second body member not coming into contact with the printed wiring board.

According to the first and second aspects of the present invention, it is preferable for the conductive material layer to include a layer of a conducting polymer, it is preferable that the conducting polymer be one or more compounds selected from the group consisting of polypyrrole, polythiophene, and polyaniline, or a derivative of the compounds, it is preferable that the conductive material layer have the conducting polymer layer disposed on the side of the dielectric coating and a conductive paste layer formed on the conducting polymer layer, and it is preferable to fix the metal member on the conductive paste layer.

According to the first and second aspects of the present invention, it is preferable that the metal having the valve action be a metal selected from the group consisting of aluminum, tantalum, and niobium, and it is preferable that the metal having the valve action, the dielectric coating, and the conductive material layer be molded with resin.

A third aspect of the present invention is a printed wiring board mounting member, characterized in that the mounting member comprises a low impedance line device having a laminated structure in which a dielectric coating having a dielectric loss is interposed between first and second conductors, first electrode leading terminals which are disposed on both ends of one of the conductors to make connection to a printed wiring board, and second electrode leading terminals for connecting both ends of a metal member for mounting the low impedance line device and the printed wiring board, the first electrode leading terminal has a connecting member connected to the first conductor, a first leg member connected to a wire on the printed wiring board, and a first body member for connecting the connecting member and the leg member, the connecting member and first leg member comprise members on both ends in the longitudinal direction of the first body member to make connection almost perpendicularly to the first body member, the second electrode leading terminal has a second body member connected to the metal member and a second leg member connected to a wire on the printed wiring board, the second body members are connected to an end on the same long side of both ends in the longitudinal direction of a mounting surface of the metal member, and the second leg member is connected to the second body member almost in parallel with the mounting surface.

A fourth aspect of the present invention is a printed wiring board mounting member, characterized in that the mounting member comprises a low impedance line device having a laminated structure in which a dielectric coating having a dielectric loss is interposed between first and second conductors, first electrode leading terminals which are disposed on both ends of one of the conductors to make connection to a printed wiring board, and second electrode leading terminals which are disposed on both ends of a metal member for mounting the low impedance line device to make connection to the printed wiring board, the first electrode leading terminal has a connecting member connected to the first conductor, a first leg member connected to a wire on the printed wiring board, and a first body member for connecting the connecting member and the leg member, members are provided on both ends in the longitudinal direction of the first body member to interpose the first body member between the connecting member and the first leg member and make connection almost perpendicularly to the first body member, and the second electrode leading terminals have second leg members connected to an end on the same long side of both ends in the longitudinal direction of a mounting surface of the metal member almost in parallel with the mounting surface.

A fifth aspect of the present invention is a printed wiring board mounting member, characterized in that the mounting member comprises a low impedance line device having a laminated structure in which a dielectric coating having a dielectric loss is interposed between first and second conductors, first electrode leading terminals which are disposed on both ends of one of the conductors to make connection to a printed wiring board, and second electrode leading terminals which are disposed on both ends of a metal member for mounting the low impedance line device to make connection to the printed wiring board, the first electrode leading terminal has a connecting member connected to the first conductor, a first leg member connected to a wire on the printed wiring board, and a first body member for connecting the connecting member and the leg member, the connecting member is connected almost perpendicularly to an end in the longitudinal direction of the first body member, and the second electrode leading terminals have second body members connected to an end on the same long side of both ends in the longitudinal direction of a mounting surface of the metal member almost perpendicularly to the mounting surface.

A sixth aspect of the present invention is a printed wiring board mounting member, characterized in that the mounting member comprises a low impedance line device having a laminated structure in which a dielectric coating having a dielectric loss is interposed between first and second conductors, first electrode leading terminals which are disposed on both ends of one of the conductors to make connection to a printed wiring board, and second electrode leading terminals which are disposed on both ends of a metal member for mounting the low impedance line device to make connection to the printed wiring board, the first electrode leading terminal has a connecting member connected to the first conductor, a first leg member connected to a wire on the printed wiring board, and a first body member for connecting the connecting member and the leg member, the connecting member is connected almost perpendicularly to a longitudinal end of the first body member, the second electrode leading terminal has a second body member connected almost to the center of a short side on both ends in the longitudinal direction of a mounting surface of the metal member almost perpendicularly to the short side, and the first electrode leading terminal and the second electrode leading terminal are disposed almost in line with each other in the longitudinal direction of the mounting surface.

Particularly it is preferable that the first leg member and the second leg member in contact with the printed wiring board be larger in cross sectional area than the first body member and the second body member not coming into contact with the printed wiring board, and it is preferable that the low impedance line device be molded with resin.

A seventh aspect of the present invention is a circuit board having a metal which has a valve action, a dielectric coating formed on a surface of the metal having the valve action, a conductive material layer formed around the metal having the valve action via the dielectric coating, and a metal member for transmitting direct-current power to be inputted, characterized in that the circuit board comprises a stripline device having first and second input/output terminals on both ends of the metal having the valve action and both ends of the metal member, a board, and a first power supply wire and a second power supply wire formed on the board, and the first power supply wire and the second power supply wire are connected to the first and second input/output terminals, respectively.

Particularly it is preferable that circuit elements for receiving power of an equal voltage be disposed on the circuit board in an integrated manner and an equal power be supplied by a bus bar.

An eighth aspect of the present invention is a semiconductor package having a metal which has a valve action, a dielectric coating formed on a surface of the metal having the valve action, a conductive material layer formed around the metal having the valve action via the dielectric coating, and a metal member for transmitting direct-current power to be inputted, characterized in that the semiconductor package comprises a stripline device having first and second input/output terminals on both ends of the metal having the valve action and both ends of the metal member, a substrate made of an insulating material, and a semiconductor chip mounted on the substrate, the substrate has a first connector pin and a second connector pin which are connected to the device mounted on the board, the semiconductor chip has a first power supply wire and a second power supply wire, and the first and second input/output terminals are connected to the connector pins of the substrate and the power supply wires of the semiconductor chip, respectively.

A ninth aspect of the present invention is a method of forming a stripline device, characterized by comprising the steps of:

forming a metal having a valve action, forming a dielectric coating on a surface of the metal having the valve action, forming a conductive material layer around the metal having the valve action via the dielectric coating to form a strip line, bonding the strip line and a plurality of substrates, on which a metal member having a second electrode leading terminal and a lead frame serving as a first electrode leading terminal are integrally formed, after performing positioning such that the conductive material layer and the metal member are in contact with each other and the lead frame and the metal having the valve action are in contact with each other, and cutting the second electrode leading terminal and the lead frame from the substrate at a predetermined distance to complete a stripline device.

BRIEF DESCRIPTION OF THE DRAWINGS

FIG. 20 is a side view showing the stripline device of FIG. 19 along the length direction and the width direction of the device.

FIG. 23 is a side view showing the stripline device of FIG. 22 along the length direction and the width direction of the device.

FIG. 31 is a side view showing a configuration when the stripline device of FIG. 30 is viewed along the length direction and the width direction of the device.

Figure 1:
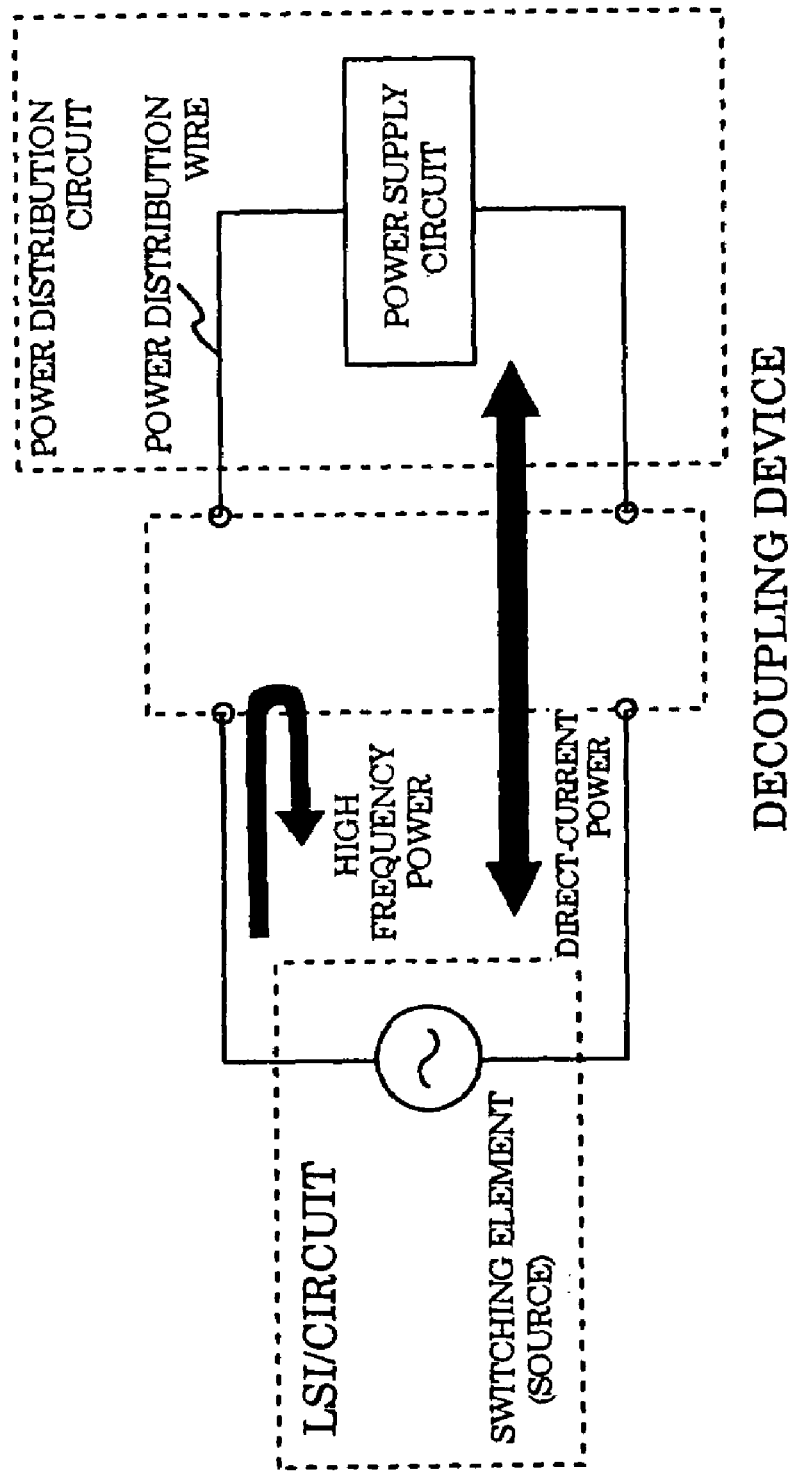
FIG. 1 is a diagram for explaining the influence of power generated from a switching element constituting an LSI on a power distribution wiring.
Figure 2:
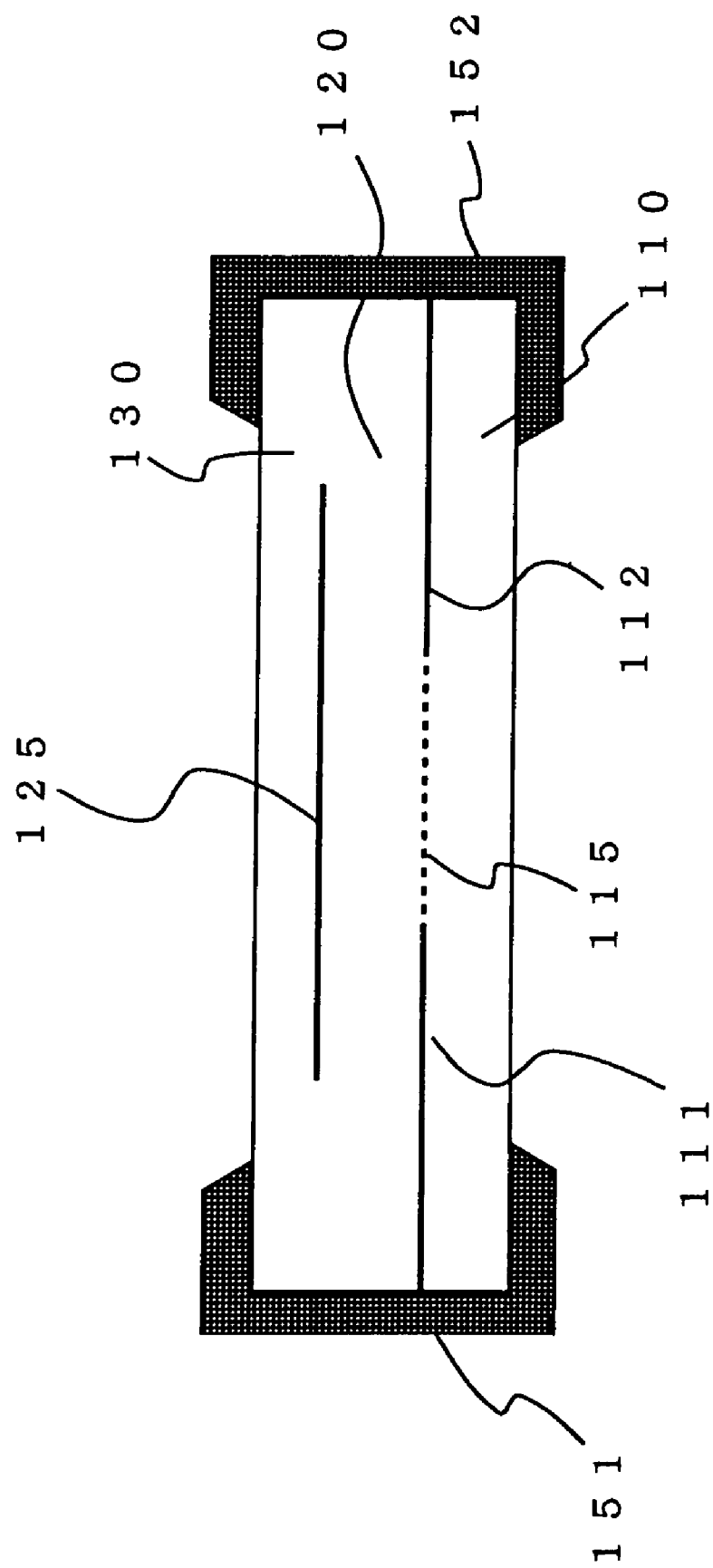
FIG. 2 is a sectional view showing an example of a conventional surface-mount filter.

In the drawings, reference numeral 1 denotes a stripline device. Reference numeral 2 (2A, 2B) denotes first electrode leading terminals (terminals). Reference numeral 3 (3A, 3B) denotes second electrode leading terminals (terminals). Reference numeral 10 denotes a valve metal. Reference numerals 11 and 12 denote first electrode leading terminals.

Reference numeral 20 denotes a dielectric coating. Reference numeral 30 denotes a conductive material layer. Reference numeral 31 denotes a conducting polymer layer. Reference numeral 32 denotes a conductive carbon paste layer. Reference numeral 33 denotes silver paste. Reference numeral 40 denotes a metal plate. Reference numerals 41 and 42 denote second electrode leading terminals. Reference numeral 60 denotes an insulating material. Reference numeral 70 denotes a printed wiring board. Reference numerals 71a and 71b denote positive power wires. Reference numerals 74a and 74b denote negative power wires. Reference numeral 79 denotes an insulating layer. Reference numeral 80 denotes a semiconductor package. Reference numerals 81a and 78b denote positive power wires. Reference numerals 84a and 84b denote negative power wires. Reference numeral 85 denotes a semiconductor chip. Reference numeral 86 denotes a connector pin. Reference numeral 89 denotes an insulating layer. Reference numeral 110 denotes a first dielectric sheet. Reference numeral 111 denotes a first internal conductor. Reference numeral 112 denotes a second internal conductor. Reference numeral 115 denotes a meandering conductor. Reference numeral 120 denotes a second dielectric sheet. Reference numerals 123 and 124 denote intervals of electrical insulation. Reference numeral 125 denotes a ground conductor. Reference numeral 130 denotes a third dielectric sheet. Reference numeral 151 denotes a first signal electrode. Reference numeral 152 denotes a second signal electrode.

BEST MODE FOR CARRYING OUT THE INVENTION

Preferred embodiments will be described below in accordance with the accompanying drawings. However, the present invention is not limited to the embodiments discussed below.

First Embodiment

Figure 3:
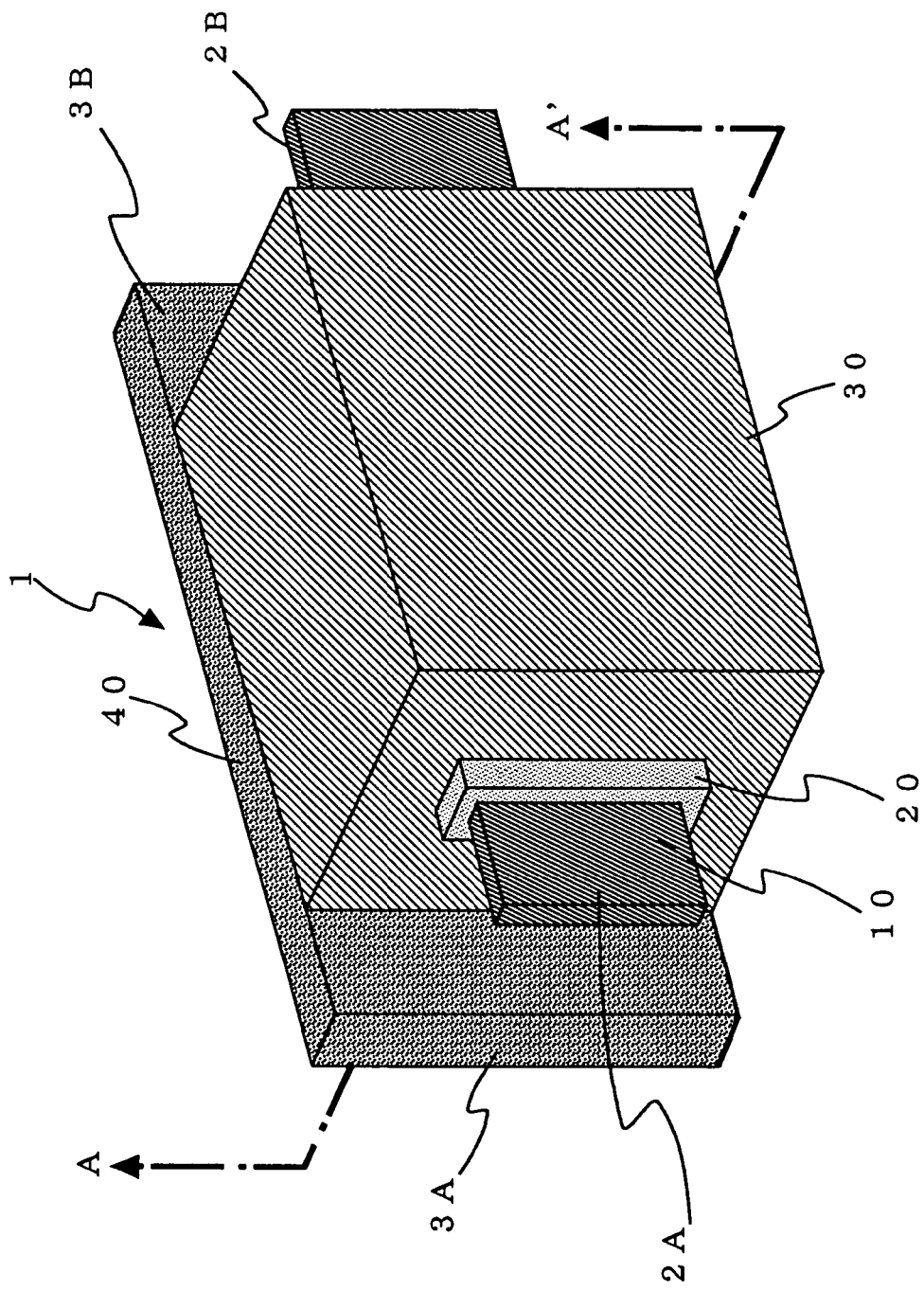
FIG. 3 is a perspective view showing an external shape of a stripline device according to an embodiment of the present invention.

FIG. 3 is a perspective view showing an external shape of a stripline device according to an embodiment of the present invention.

Figure 4:
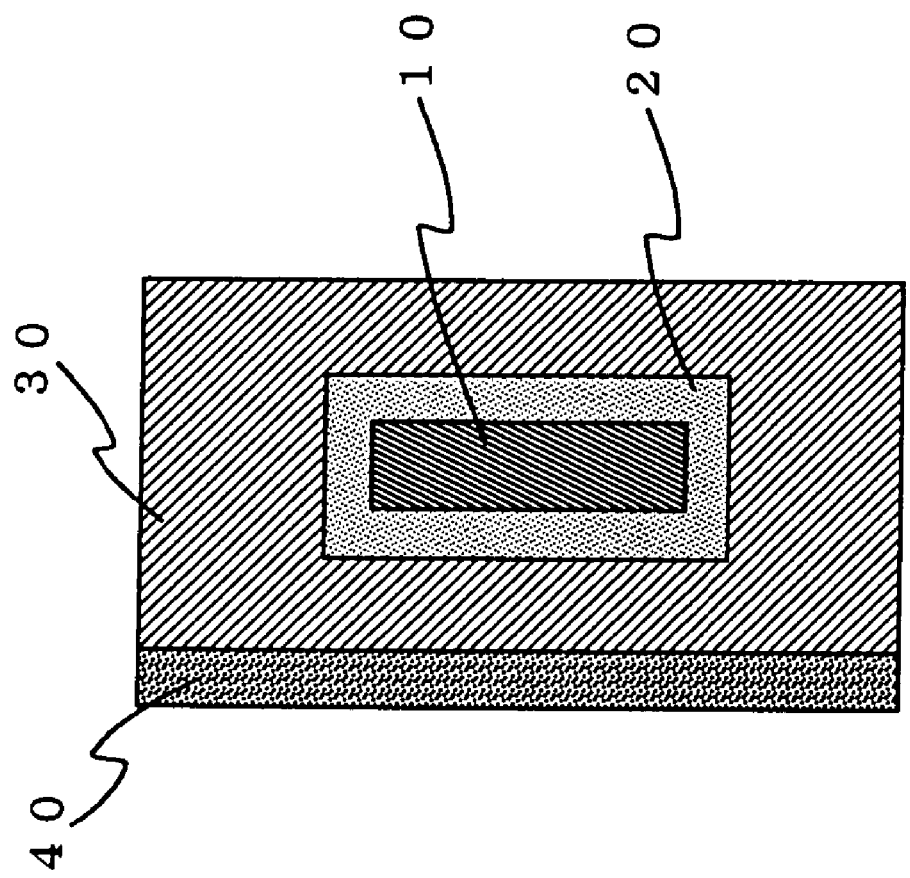
FIG. 4 is a sectional view taken along line A-A' of FIG. 3.

FIG. 4 is a sectional view showing the stripline device taken along line A-A' of FIG. 3.

As shown in FIGS. 3 and 4, the stripline device of the present invention comprises a metal (hereinafter, referred to as a valve metal) 10 which has a dielectric coating 20 on its surfaces and is shaped like a long plate with a valve action, and a conductive material layer 30 with which the valve metal 10 is coated via the dielectric coating 20. In this configuration, as shown in FIG. 3, the stripline device 1 comprises the valve metal 10 which is almost flat. Both ends in the longitudinal direction of the valve metal 10 are almost in line with the ends of the stripline device 1.

For example, the valve metal 10 is made of aluminum. In the example of FIG. 3, the valve metal 10 is a rectangle which is, e.g., 110 μm in thickness, 30 mm in length, and 10 mm in width. The shape of the valve metal 10 in cross section is not limited to a rectangle and may be an oval or a ring. The surfaces of the valve metal 10, that is, the front side, back side, and end faces of the valve metal 10 are increased in surface area by about 200 times by electrolytic etching in an electrolytic solution. Spongy holes are formed on the valve metal 10.

The conductive material layer 30 is formed so as to cover the valve metal 10 via the dielectric coating 20 except for both ends of the valve metal 10. The material and so on of the conductive material layer 30 are not particularly limited as long as the material is conductive. For example, various metals, semiconductors such as manganese dioxide and indium oxide, or organics conductors such as a charge-transfer complex of tetracyanoquinodimethane and tetrathiafulvalene are available.

Particularly, for the conductive material layer 30, conducting polymers are preferable, examples of which include polypyrrole, polythiophene, polyethylene dioxythiophene, polyaniline, polypheylene, polyfuran, polythiazyl, polyphenylenevinylene, polyacetylene, and polyazulene. Particularly, polypyrrole, polythiophene, polyaniline, and derivatives thereof are preferable in view of stability. In the present invention, derivatives of polypyrrole, polythiophene, and polyaniline include, e.g., derivatives obtained by adding various substituents to these compounds and derivatives obtained by copolymerization with other high polymers.

In the present invention, these conducting polymers are generally used after being combined with a dopant composed of an electron-donating or electron-withdrawing compound. In the present invention, a dopant combined with the conducting polymers is not particularly limited. A conventionally known dopant is used for the conducting polymers. For example, such a dopant includes a dopant acting as a halogen compound of iodine, chlorine, anion perchlorate or the like, a dopant acting as a Lewis acid of an aromatic sulfonic acid compound or the like, or a dopant acting as a Lewis base such as lithium and tetraethylammonium.

To further reduce an impedance, a metal plate 40, which is made of copper, silver, gold, aluminum, or other materials with a low electric resistance, is disposed so as to face either or both surfaces of the valve metal. The conductive material layer 30 is interposed between the metal plate 40 and the valve metal. In the present embodiment of FIG. 3, the metal plate 40 is disposed in contact with one side of a rectangular parallelepiped. The metal plate 40 may be disposed so as to surround (or partially surround) the rectangular parallelepiped. Since the conductive material layer 30 is an extremely thin film, the metal plate is disposed outside the conductive material layer 30 so as to surround the conductive material layer 30 in order to obtain mechanical strength and reduce an electric resistance.

In the present invention, regarding these conducting polymers constituting the conductive material layer 30, a forming method is not particularly limited. The conducting polymers can be formed as follows: a solution of conducting polymers is developed and evaporated on the surfaces of the valve metal 10 where the dielectric coating 20 is formed (i.e., on the dielectric coating), a monomer and an oligomer, which form the conducting polymers, and a polymerization catalyst are introduced to polymerize conducting polymers directly on the surfaces of the valve metal, or a high-polymer layer composed of an intermediate of conducting polymers is formed and converted into conducting polymers.

Further, a connection to a wiring board and an electronic circuit board may be made by direct mounting on the board. Alternatively, an electrode may be drawn and sealed with a resin, a metallic case, and so on. As an example of a configuration having electrode leading terminals, in the present embodiment, first electrode leading terminals 2A and 2B are provided on both ends in the longitudinal direction of the valve metal 10, and second electrode leading terminals 3A and 3B are provided on both ends in the longitudinal direction of the metal plate 40. For example, the first electrode leading terminals 2 may be formed by protruding the valve metal 10 to both sides or may be attached by welding and crimping. Similarly, the second electrode leading terminals 3A and 3B may be formed by protruding the metal plate 40 to both sides or may be attached by welding and crimping. The shape of the electrode leading terminal is determined according to a pattern of mounting on a printed wiring board or the like.

As shown in FIG. 1, the terminals 2A and 3A are a terminal pair for receiving direct-current power fed from a power supply circuit, and the terminals 2B and 3B are a terminal pair for feeding direct-current power to an LSI.

Moreover, the dielectric coating 20 is made of a material for forming a line capacitance extremely larger than a line inductance formed between the first electrode leading terminals 2A and 2B and the second electrode leading terminals 3A and 3B, so that a line impedance has an extremely small value. Hence, the stripline device of FIG. 3 according to the embodiment of the present invention acts so as to almost totally reflect high frequency electromagnetic waves of signal components, which are generated by switching and so on of a transistor in an LSI circuit, and unwanted electromagnetic waves entering from the power supply circuit to the LSI.

In the embodiment of the present invention, the characteristics of the stripline device as viewed from the terminals 2A and 3A are completely similar to characteristics viewed from the terminals 2B and 3B. Hence, also when the direct-current power is received by the terminals 2B and 3B, the action of the stripline device is similar to the above.

In the present invention, the kind of the valve metal is not particularly limited. Metals for forming surface coatings that include tantalum, aluminum, niobium, titanium, zirconium, silicon, and magnesium are available as the valve metal 10. These metals are used in the form of rolled foil, impalpable powder sintered compact, and so on. Particularly a metal selected from the group consisting of tantalum, aluminum, and niobium is preferably used as the valve metal 10.

Further, the method of forming the dielectric coating 20 on the surfaces of the valve metal is not particularly limited. For example, the dielectric coating 20 may be formed by electrolytic formation using an electrolytic solution or formed by using a proper oxidizer. Alternatively, an oxide film formed by air oxidation is directly used as the dielectric coating 20 of the present invention. However, the dielectric coating is generally formed by electrolytic formation.

The shape of the valve metal 10 is not particularly limited. In view of a calculation of a characteristic impedance and working, a planar shape (rectangular in cross section perpendicular to the longitudinal direction of the valve metal) is preferable but a curved shape and a partially bent shape may be also used. A columnar or cylindrical shape is also applicable.

The surfaces of the valve metal 10 can be made larger in the present invention. A valve metal with larger surfaces includes an impalpable powder sintered compact formed into a plate and etching foil having been subjected to electrolytic etching in an electrolytic solution.

As described above, in the present invention, the conductive material layer 30 is preferably composed of conducting polymers. The following configuration may be applicable: a layer in contact with the dielectric coating 20 is composed of conducting polymers and another kind of conductive material layer is formed on the layer of conducting polymers. The solid electrolyte of the conductive material and the metal plate can be in contact with each other as they are or can be connected to each other using conductive carbon paste and silver paste.

For example, the conductive material layer 30 may have a three-layer structure of a conductive polymer layer directly coming into contact with the dielectric coating 20, conductive carbon paste disposed on the conductive polymer layer, and silver paste disposed on the conductive carbon paste. The metal plate is mounted by the silver paste.

The stripline device of the present embodiment is constituted of the valve metal 10 having the dielectric coating 20, the conductive material layer 30 disposed around the valve metal 10 via the dielectric coating 20, the pair of electrode leading terminals 2A and 2B disposed on different positions of the valve metal 10, and the pair of electrode leading terminals 3A and 3B disposed on different positions of the conductive material layer. This configuration increases an apparent dielectric loss and thus the characteristic impedance of the stripline device can be sufficiently reduced, thereby preventing an electromagnetic wave generated from a noise source from entering a power distribution circuit.

The following will specifically describe an example of the manufacturing of the stripline device according to the first embodiment. The present invention is not limited to the manufacturing procedure discussed below.

Figure 5:
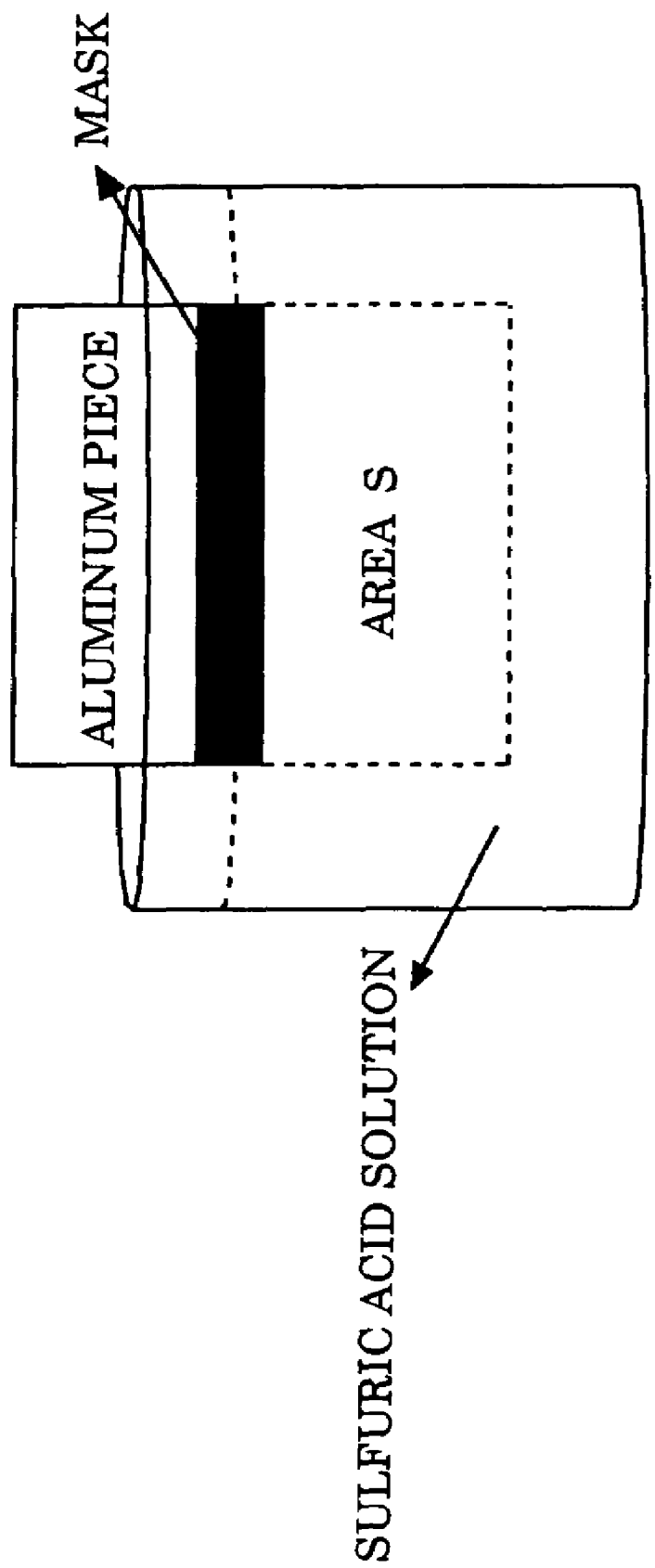
FIG. 5 is a diagram for explaining a method of measuring the capacitance of an aluminum piece.

In the stripline device shown in FIGS. 3 and 4, aluminum foil was used as the valve metal 10. The aluminum foil was increased in surface area by about 200 times by etching and had a thickness of 110 μm. The aluminum foil was 10 mm in width and 30 mm in length. On both ends of the aluminum foil (valve metal 10), a mask (not shown) was formed using fluorocarbon polymers of hexafluoropropylene. Then, the aluminum foil was anodized at 10 V in an aqueous solution of 5 mass % ammonium borate and was cleaned and dried, so that the aluminum foil was obtained which had the dielectric coating 20 composed of a metal oxide coating. The foil was dipped into a sulfuric acid solution of 0.05 mol/L and a capacitance of about 380 μF was measured. As shown in FIG. 5, the capacitance is measured while the foil is dipped into the sulfuric acid solution. The sulfuric acid solution has a high electric conductivity and soaks into the gaps of the dielectric coating and thus it is possible to accurately measure a capacitance proportionate to an area of the dielectric coating. In this case, although the low reaction velocity of the sulfuric acid solution seems to be a concern, the sulfuric acid solution has a low measuring frequency of about 120 Hz and thus the reaction velocity causes no problem. Further, the solution is not limited to the sulfuric acid solution and thus any solution is applicable as long as the solution possesses conductivity.

Subsequently, in a glass container, an aqueous solution was prepared which contained 10 mass % p-toluenesulfonic acid and 5 mass % aniline, the valve metal 10 having the dielectric coating 20 and the mask thereon was dipped into the aqueous solution and then was pulled out. In air of room temperature, the valve metal 10 was dried for 30 minutes at room temperature. Then, the valve metal 10 was dipped into an aqueous solution containing 10 mass % ammonium peroxodisulfate and 10 mass % p-toluenesulfonic acid, pulled out, and left in the air for 20 minutes to polymerize aniline.

Thereafter, the valve metal 10 was cleaned with water and methanol and dried in an atmosphere of 80° C. These operations were repeated four times. The conductive carbon paste and silver paste were sequentially applied to complete the conductive material layer 30, and the metal plate 40 composed of copper foil of about 100 μm was fixed to the conductive material layer 30 with the silver paste. Then, both ends of the valve metal 10 were dipped into tetrahydrofuran, and hexafluoropropylene acting as a resin constituting the mask was dissolved and removed.

Second Embodiment

Figure 6:
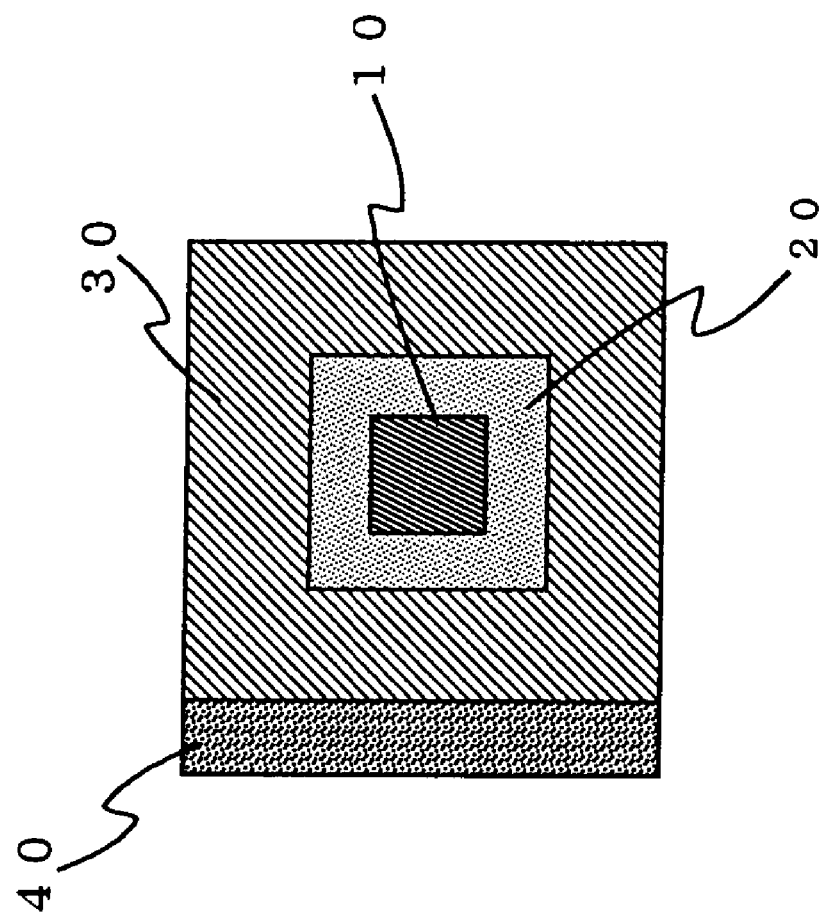
FIG. 6 is a sectional view showing a stripline device according to the second embodiment of the present invention.

Referring to FIG. 6, the second embodiment of the present invention will be discussed below. The configuration of a stripline device of the present embodiment is different from that of the stripline device of the first embodiment in that a valve metal 10 is almost shaped like a square in cross section. Other configurations of the stripline device of the present embodiment are similar to those of the stripline device of the first embodiment.

Third Embodiment

Figure 7:
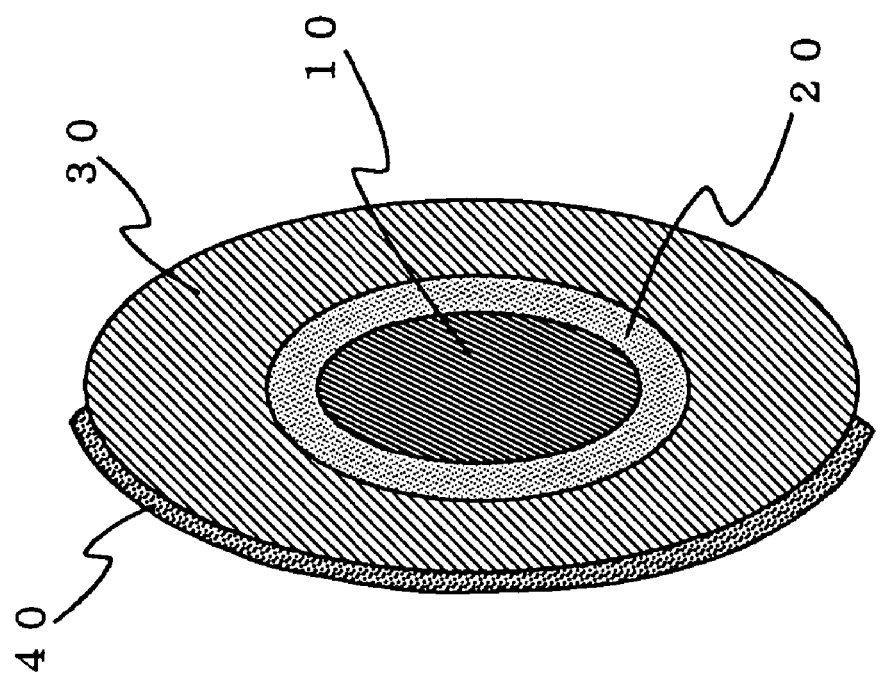
FIG. 7 is a sectional view showing a stripline device according to the third embodiment of the present invention.

Referring to FIG. 7, the third embodiment of the present invention will be discussed below. The configuration of a stripline device of the present embodiment is different from that of the stripline device of the third embodiment in that a valve metal 10 is almost shaped like a circle or an oval in cross section. Other configurations of the stripline device of the present embodiment are similar to those of the stripline device of the first embodiment.

Fourth Embodiment

Figure 8:
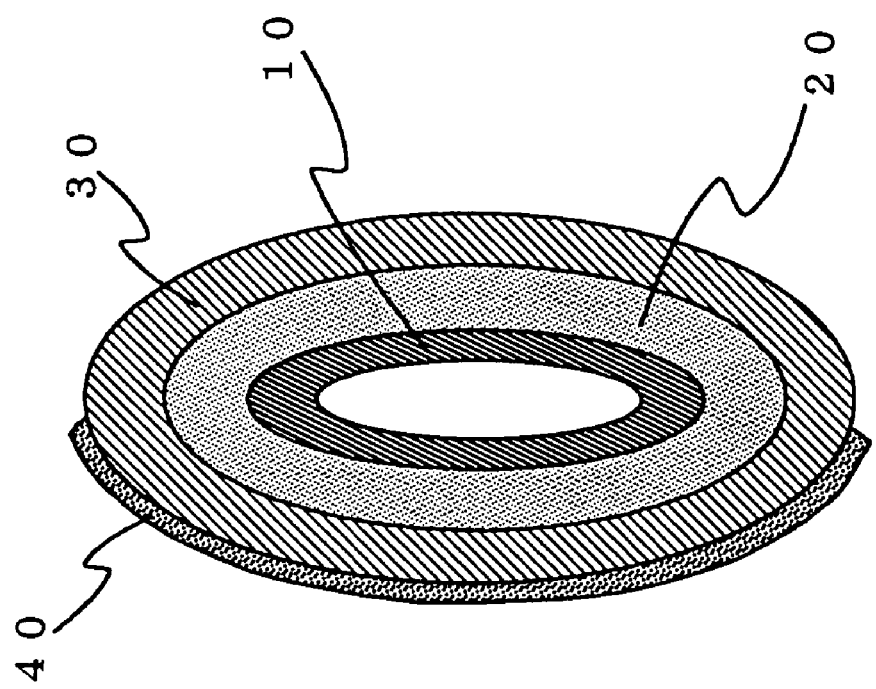
FIG. 8 is a sectional view showing a stripline device according to the fourth embodiment of the present invention.

Referring to FIG. 8, the fourth embodiment of the present invention will be discussed below. The configuration of a stripline device of the present embodiment is different from that of the stripline device of the first embodiment in that a valve metal 10 is almost shaped like a ring in cross section. That is, the cylindrical valve metal 10 is used. Other configurations of the stripline device of the present embodiment are similar to those of the stripline device of the first embodiment.

Fifth Embodiment

Figure 9:
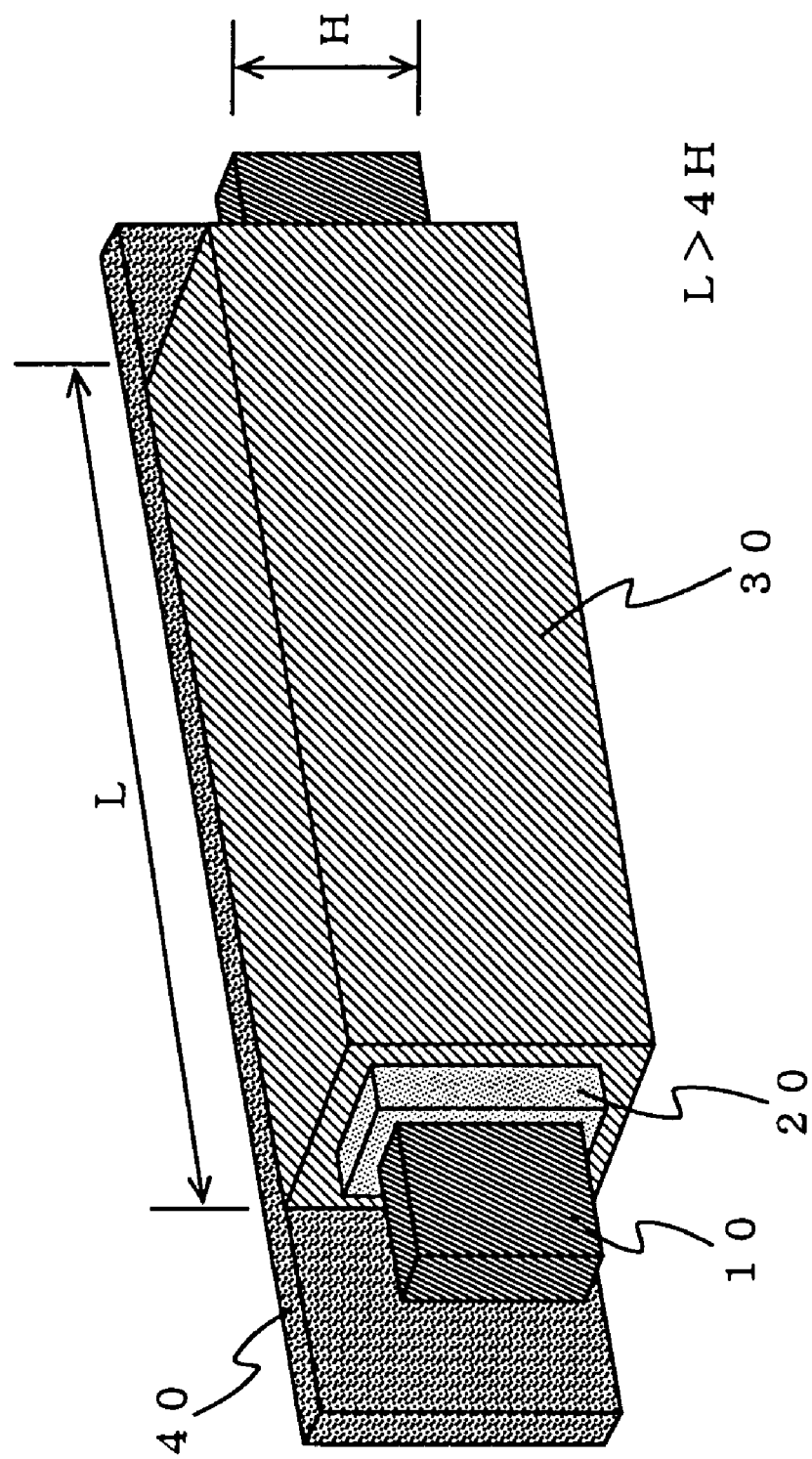
FIG. 9 is a sectional view showing a stripline device according to the fifth embodiment of the present invention.

Referring to FIG. 9, the fifth embodiment of the present invention will be discussed below. The configuration of a stripline device of the present embodiment is different from that of the stripline device of the first embodiment in that a valve metal 10 has a longitudinal dimension L which is larger than a cross-sectional dimension H by four times or more. That is, since the length is larger than the width in cross section, the valve metal 10 can act as a line. As the valve metal 10, two types of stripline devices were formed using metals which were 16 mm and 32 mm in length and 1.8 mm in width. The conductive material layer 30 was composed of polythiophene, carbon paste, and silver paste. The dielectric coating 20 was formed at a formation voltage of 8 V.

Both ends of the two kinds of stripline devices obtained thus were connected to a network analyzer and a power transmission property S21 was measured. An impedance value was determined from values of a real part and an imaginary part without consideration of an internal loss. The type with a length of 16 mm had an impedance value of 0.2 m$\Omega$ to 0.8 m$\Omega$, which was somewhat even in a frequency area of 20 MHz to 200 MHz. The impedance value was 10 m$\Omega$ or lower even in a frequency area of 1 MHz to 1 GHz. Meanwhile, the type with a length of 32 mm had a more preferable result. The impedance value was around 0.1 m$\Omega$, which is somewhat even in a frequency area of 7 MHz to 150 MHz. The impedance value was 10 m$\Omega$ or lower even in a frequency area of 2 MHz to 1 GHz.

Consequently, it was found that both types are lower in impedance by two to three digits over several kHz to several GHz as compared with a 0.1 μF multilayer chip ceramic capacitor, which is the most common high frequency capacitor. In this way, it is understood that as compared with conventional capacitors, the stripline device according to the embodiment of the present invention has an extremely excellent impedance characteristic particularly for advanced digital devices.

Sixth Embodiment

Figure 10:
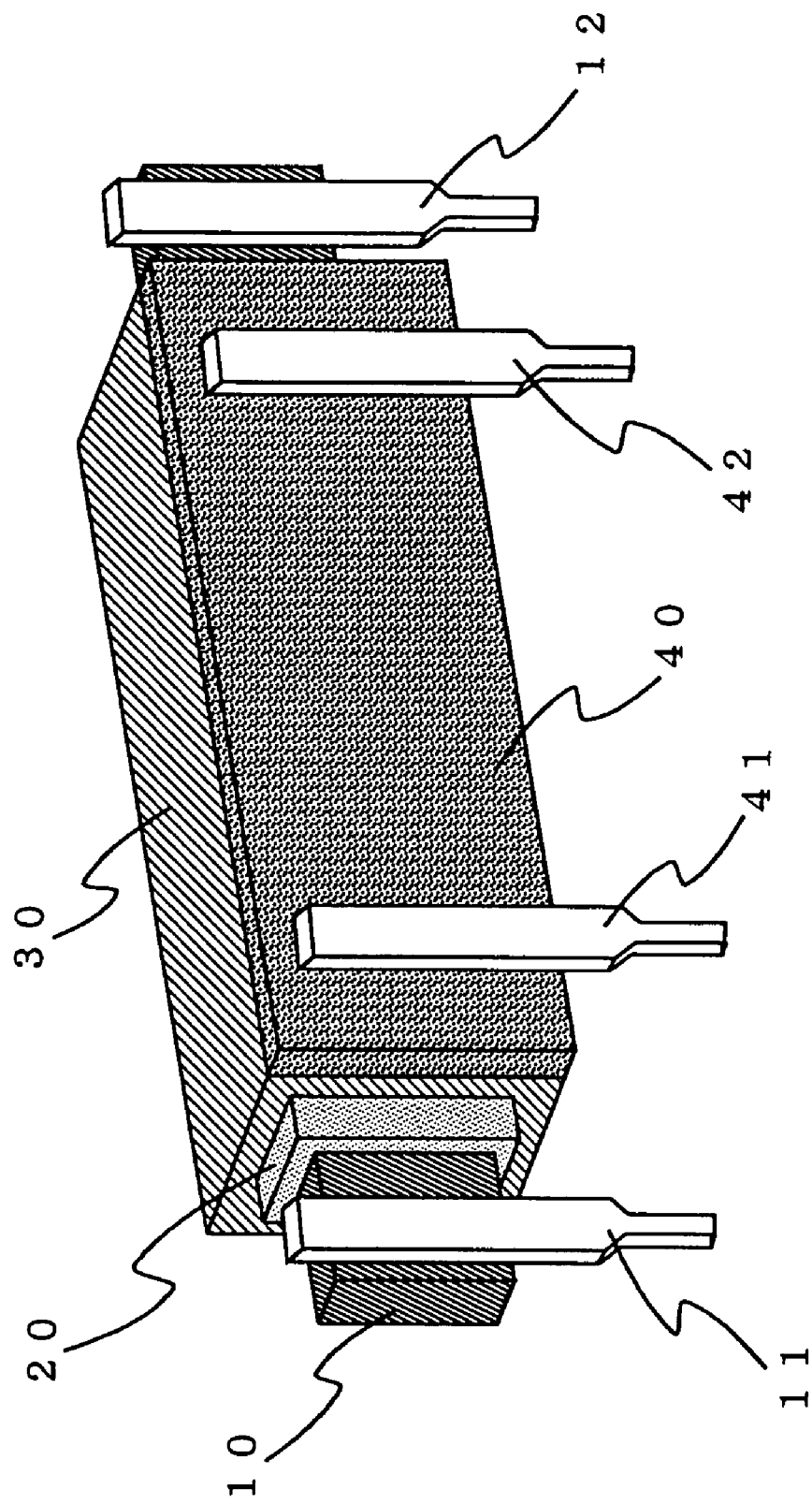
FIG. 10 is a sectional view showing a stripline device according to the sixth embodiment of the present invention.

Referring to FIG. 10, the sixth embodiment of the present invention will be discussed below. A stripline device of the present embodiment is configured such that electrode leading terminals 11 and 12 in a pair, which is shaped so as to be mounted in through holes of a printed wiring board, are provided on both ends in the longitudinal direction of a valve metal 10, and electrode leading terminals 41 and 42 in a pair, which is shaped so as to be mounted in the through holes of the printed wiring board, are provided on different positions of a metal plate 40. This configuration can obtain the stripline device suitable for mounting on the printed wiring board.

Seventh Embodiment

Figure 11:
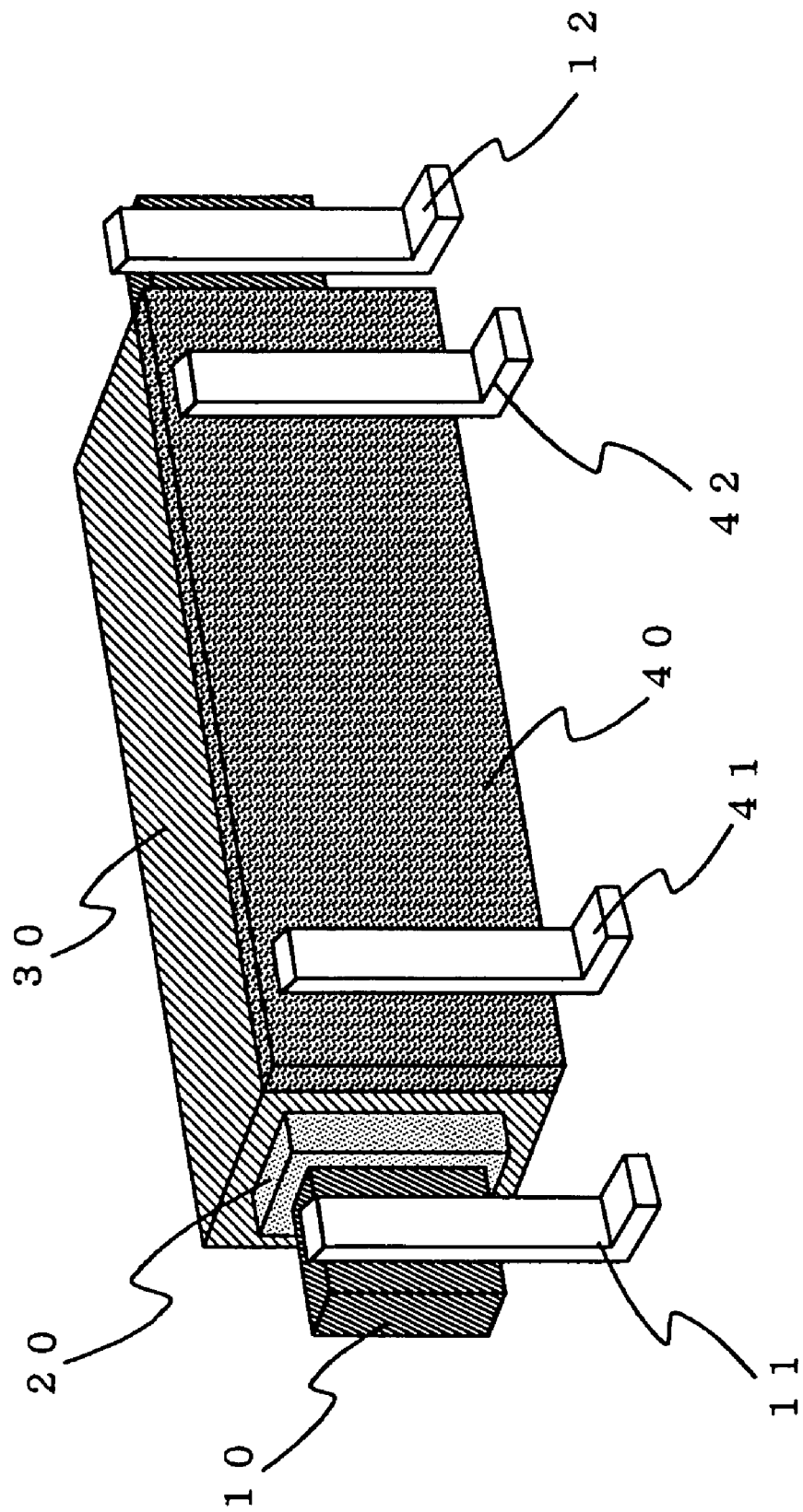
FIG. 11 is a sectional view showing a stripline device according to the seventh embodiment of the present invention.

Referring to FIG. 11, the seventh embodiment of the present invention will be discussed below. A stripline device of the present embodiment is configured such that electrode leading terminals 11, 12, 41, and 42 in the form of the letter L suitable for surface mounting are provided on both ends in the longitudinal direction of a valve metal 10. If surface mounting is not necessary, the shapes of the electrode leading terminals are not limited to letter L. Straight shapes which are polygonal, semicircular, and circular in cross section are also applicable.

Eighth Embodiment

Figure 12:
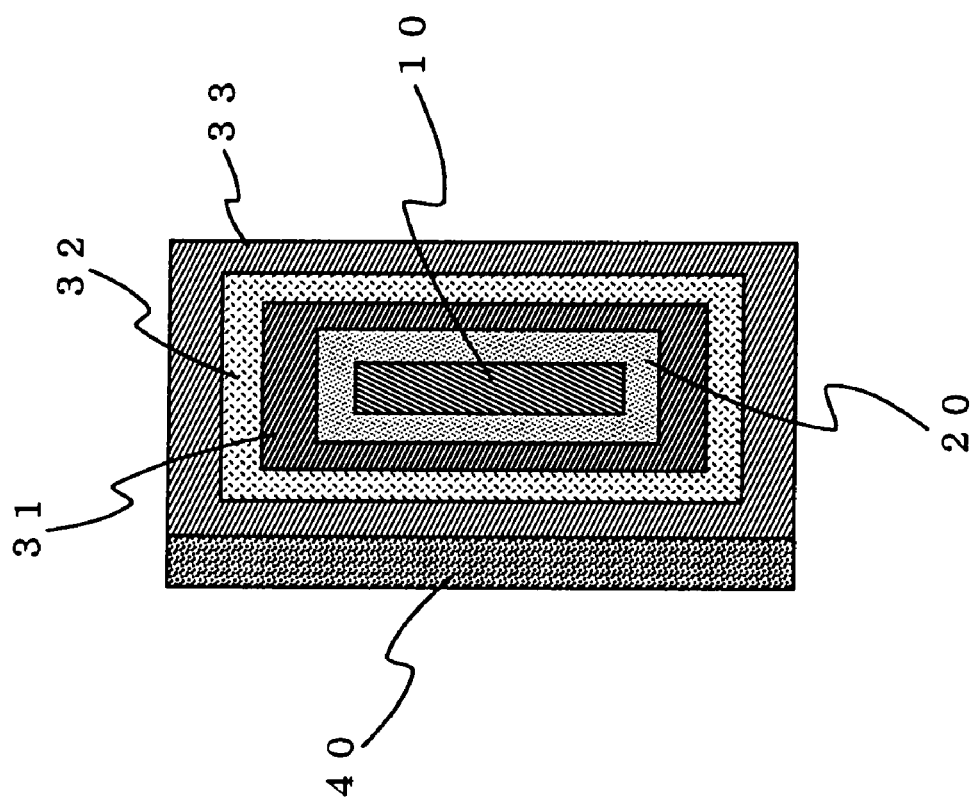
FIG. 12 is a sectional view showing a stripline device according to the eighth embodiment of the present invention.

Referring to FIG. 12, the eighth embodiment of the present invention will be discussed below. A stripline device of the present embodiment is different from that of the first embodiment in that the conductive material layer 30 of FIG. 4 is constituted of a layer 31 of conducting polymers, a conductive carbon paste layer 32, and a silver paste layer 33. Other configurations of the stripline device of the present embodiment are similar to those of the stripline device of the first embodiment.

Ninth Embodiment

The ninth embodiment of the present invention will be discussed below. A stripline device of the present embodiment is different from that of the eighth embodiment in that the layer 31 of conducting polymers shown in FIG. 12 is composed of one or more compounds selected from the group consisting of polypyrrole, polythiophene, and polyaniline, or a derivative of the compounds. Other configurations of the stripline device of the present embodiment are similar to those of the stripline device of the eighth embodiment.

Tenth Embodiment

The tenth embodiment of the present invention will be discussed below. A stripline device of the present embodiment is different from those of the eighth and ninth embodiments in that the stripline device is constituted of a conductive paste layer instead of the conductive carbon paste layer 32 and the silver paste layer 33. Other configurations of the stripline device of the present embodiment are similar to those of the stripline devices of the eighth and ninth embodiments.

Eleventh Embodiment

The eleventh embodiment of the present invention will be discussed below. A stripline device of the present embodiment is different from that of the tenth embodiment in that a metal plate 40 is fixed on the conductive paste layer of the stripline device of the tenth embodiment. Other configurations of the stripline device of the present embodiment are similar to those of the stripline device of the tenth embodiment.

Twelfth Embodiment

The twelfth embodiment of the present invention will be discussed below. A stripline device of the present embodiment is different from those of the first to eleventh embodiments in that a valve metal 10 is made of a metal selected from the group consisting of aluminum, tantalum, and niobium. Other configurations of the stripline device of the present embodiment are similar to those of the stripline devices of the first to eleventh embodiments.

Thirteenth Embodiment

Figure 13:
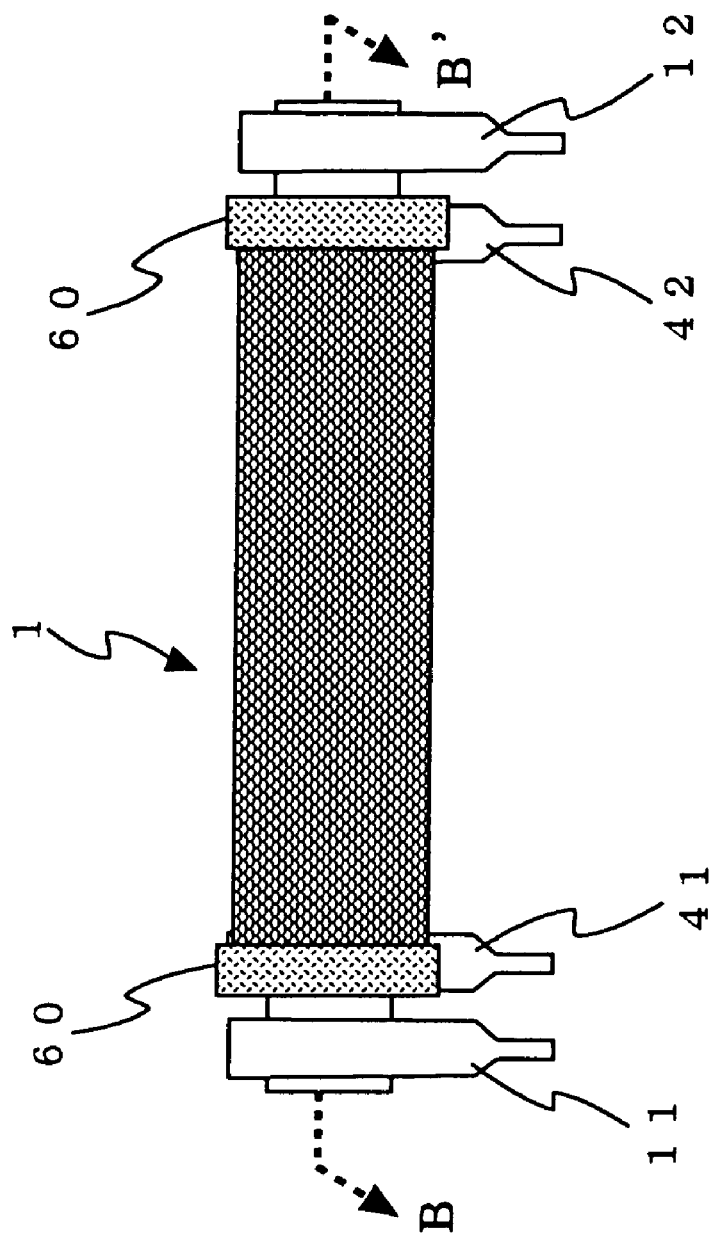
FIG. 13 is a sectional view showing a stripline device according to the ninth embodiment of the present invention.
Figure 14:
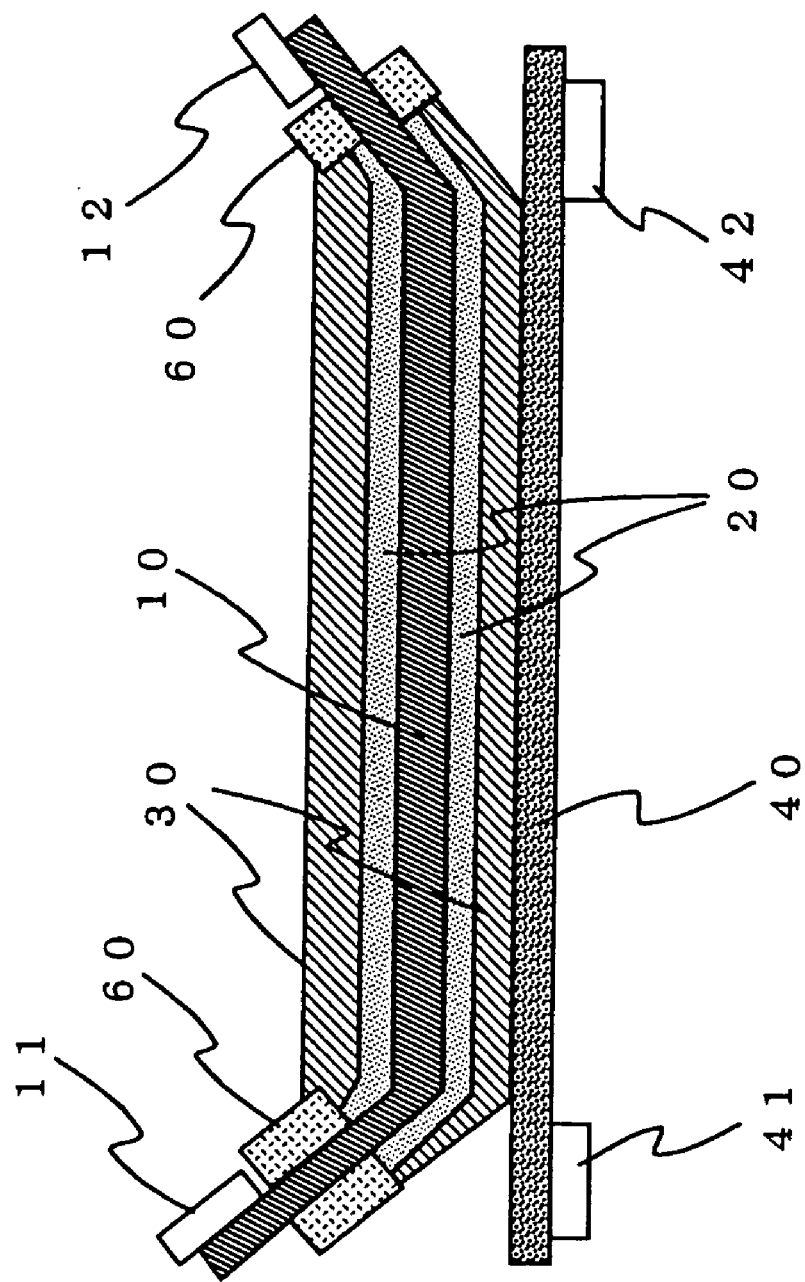
FIG. 14 is a sectional view taken along line B-B' of FIG. 13.

Referring to FIGS. 13 and 14, the thirteenth embodiment of the present invention will be discussed below. As shown in FIG. 14, a stripline device of the present embodiment has a dielectric coating 20 formed so as to sandwich a valve metal 10 and a conductive material layer 30 formed so as to sandwich the dielectric coating 20. A metal plate 40 is bonded to one surface of a laminated body in which the valve metal 10, the dielectric coating 20, and the conductive material layer 30 are laminated in the above order. Further, an insulating material 60 is disposed on both ends of the front and back sides of the valve metal 10 and surrounds both ends of the dielectric coating 20 and the conductive material layer 30. First electrode leading terminals 11 and 12 are provided outside the ends having the insulating material on the valve metal 10. Second electrode leading terminals 41 and 42 are provided on the opposite surface of the metal plate 40 from the surface having the valve metal 10, the dielectric coating 20, and the conductive material layer 30.

The stripline device of the present embodiment, in which the valve metal 10, the dielectric coating 20, and the conductive material layer 30 are laminated thus on the metal plate 40, is bent or curved in the same direction from a major surface in the vicinity of both ends of the device. When a member is bent or curved thus in a plane along the same direction, fabrication can be readily performed by dipping and the stripline device can be shortened in the longitudinal direction, so that other components can be avoided during mounting. Moreover, in the present embodiment, the stripline device is bent or curved in a plane perpendicular to a mounting substrate surface for mounting the stripline device. The device may be bent or curved vertically with respect to a surface in parallel with the mounting substrate surface.

Figure 15:
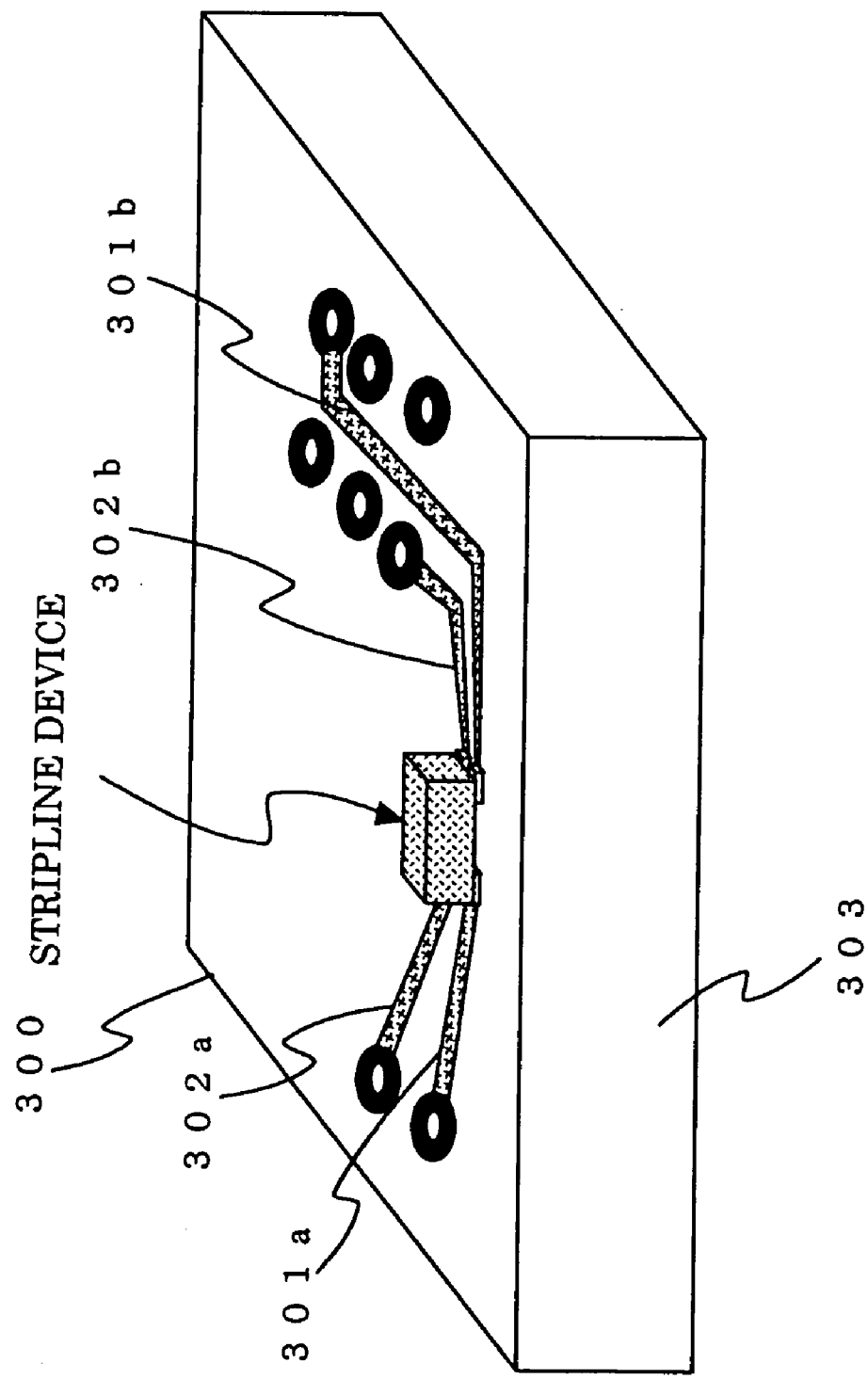
FIG. 15 is a perspective view showing a configuration when the stripline device of the present invention is mounted on a multilayer printed wiring board.

Referring to FIG. 15, the following will discuss a circuit configuration for mounting the stripline devices of the first to thirteenth embodiments on a multilayer printed wiring board.

A circuit board shown in FIG. 15 comprises a multilayer printed board 303, the stripline device mounted on a surface of the multilayer printed board 303, power supply wires 301a and 301b connected respectively to anode leading terminals 11 and 12 (not shown) of the stripline device, and ground wires 302a and 302b connected respectively to cathode leading terminals 41 and 42 (not shown) of the stripline device. The power supply wires 301a and 301b and the ground wires 302a and 302b are each formed on the multilayer printed board 303 by using a material such as copper of high electric conductivity.

A number of circuit components (not shown) are mounted on the multilayer printed board 303. High frequency noise from the circuit components is superimposed on the power supply wires 301a and 301b and the ground wires 302a and 302b, propagates through these wires, and causes circuit elements to malfunction. By filtering the noise in the stripline device, a malfunction caused by high frequency noise is less likely to occur on the circuit board of FIG. 15, thereby achieving stable circuit operations at high frequencies.

Further, when a number of circuit components are mounted on the circuit board, the circuit components are disposed close to each other, so that a noise source and the circuit components affected by the noise source are disposed close to each other. Also in this case, the stripline device inserted into the power supply wires and the ground wires efficiently filters noise superimposed on the power supply wires and the ground wires. Thus, the circuit board using the stripline device of the present invention can achieve high-density packaging on the circuit board operating at high frequencies.

Figure 16:
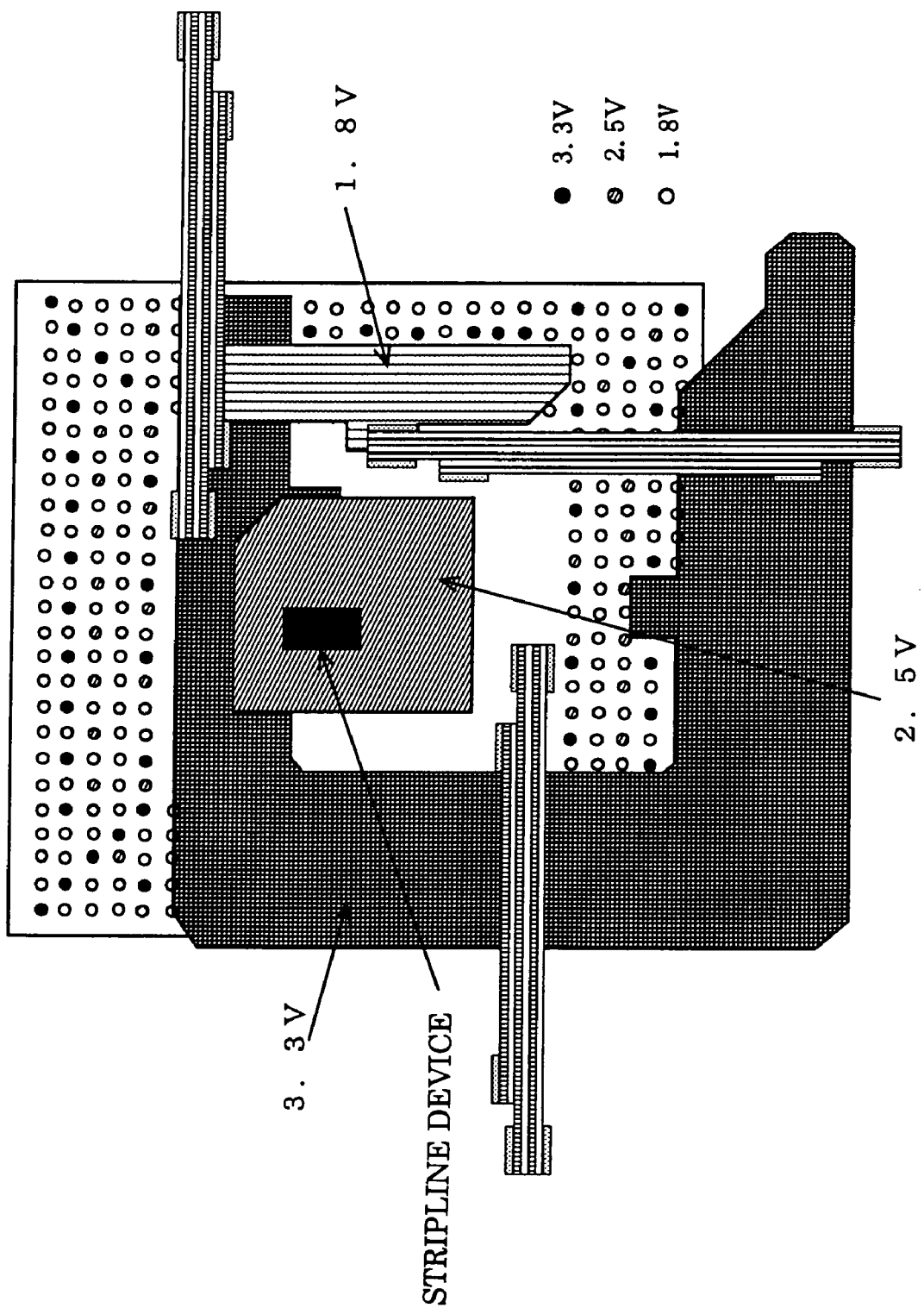
FIG. 16 is a diagram showing a configuration when a bus bar is provided and the stripline device is mounted on the multilayer printed wiring board.
Figure 17:
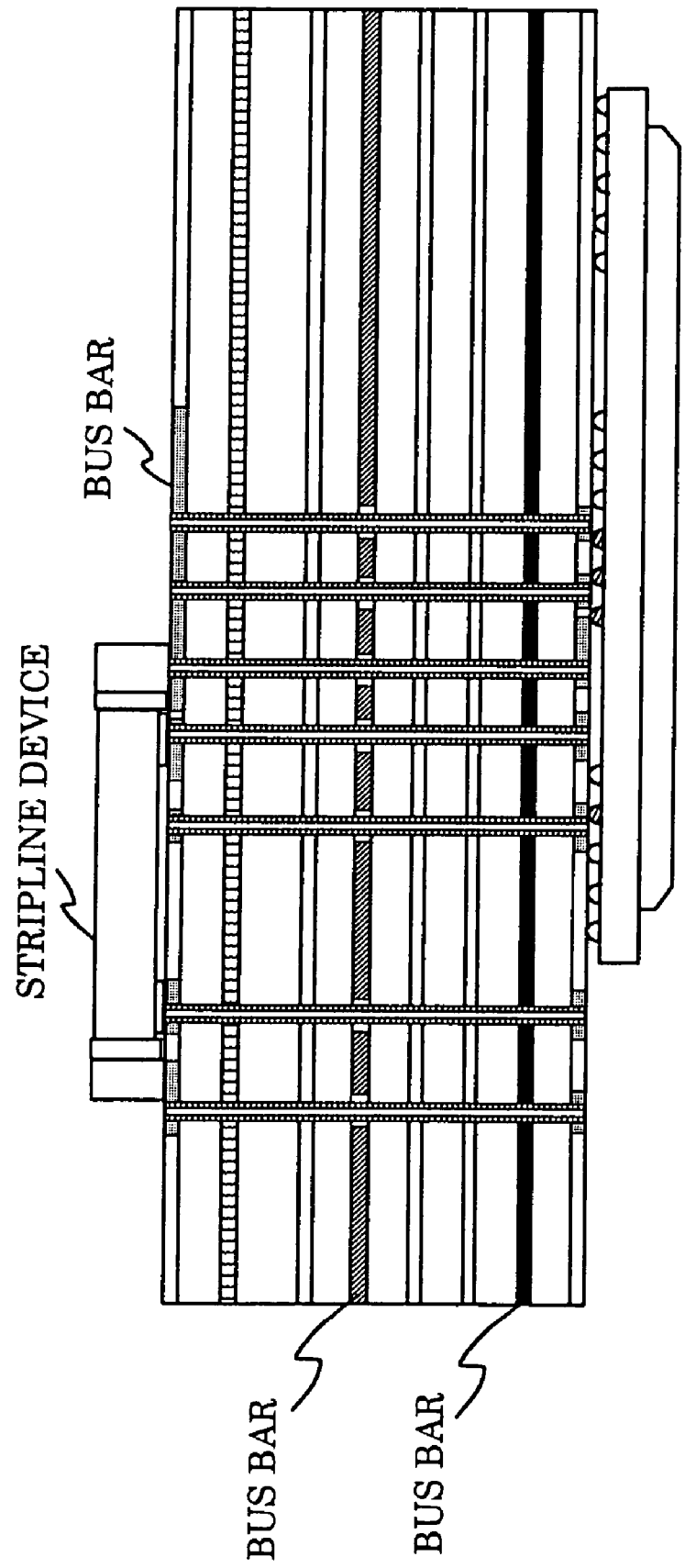
FIG. 17 is a sectional view showing the multilayer printed wiring board shown in FIG. 16.

As shown in FIG. 16, the multilayer printed wiring board having the stripline device may supply power to each circuit element by using a bus bar. When a number of signal pins are disposed immediately under an LSI to be mounted or no pin is present in a central area of the board, receiving pads are provided to connect the bus bar to the board. In the embodiment of FIG. 16, for example, circuit elements are mounted on the board so as to correspond to supplied voltages such as 3.3 V, 2.5 V, and 1.8 V and power is supplied to the board by the bus bar. Besides, printed wiring boards using bus bars may be laminated as shown in FIG. 17. Alternatively, circuit elements for supplying different powers may be mounted on a single board and bus bars may be provided to supply the corresponding powers.

Figure 18:
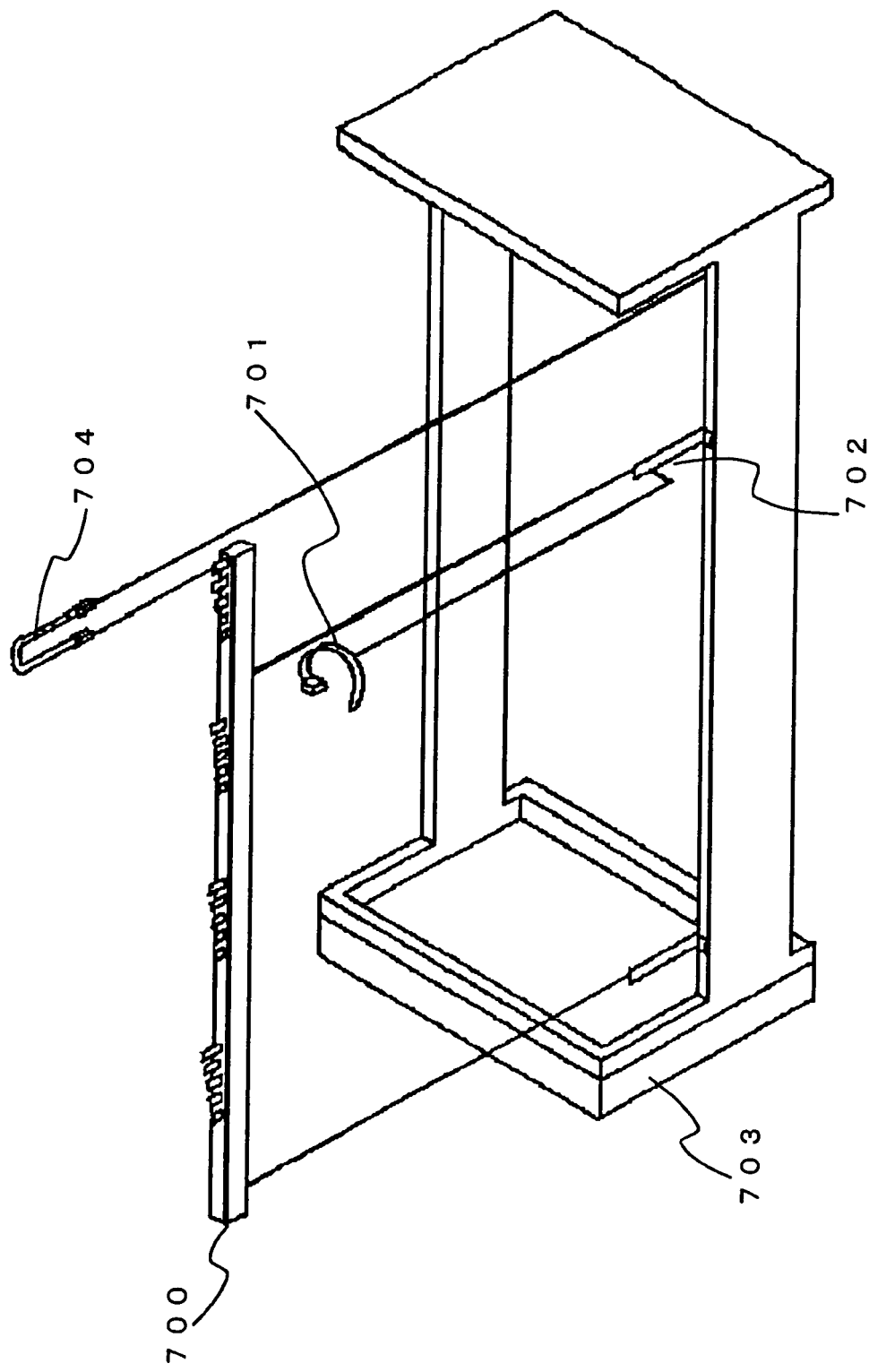
FIG. 18 is a structural diagram showing the configuration of the bus bar.

The bus bars in layers are fixed on an apparatus via an insulator, and a frame ground connection cable connects a frame ground layer and a body frame ground of the bus bar. FIG. 18 is a perspective view showing an example of the bus bar. In FIG. 18, reference numeral 700 denotes the bus bar, reference numeral 701 denotes a bus bar fixing vinyl band, reference numeral 702 denotes a bus bar support (supporting portion), reference numeral 703 denotes an apparatus body ground frame, and reference numeral 704 denotes the frame ground connection cable. That is, the bus bar 700 is fixed on the bus bar support 702 by using the bus bar fixing vinyl band 701, which is an insulator, and the frame ground connection cable 704 connects the frame ground layer of the bus bar 700 and the body frame ground 703.

In the above description, a wire paired with the power supply wire is the ground wire. A negative power supply wire may be paired with the power supply wire. Further, in the above description, the stripline device is mounted on the surface of the multilayer printed board 303. The same effect can be obtained by mounting the stripline device of the present invention on an internal board surface of a multilayer board constituting the multilayer printed board 303.

A structure for mounting the stripline device on the multilayer printed wiring board 303 will be further discussed below. In the present embodiment, as shown in FIG. 19, the stripline device 1 is mounted on the metal plate 40, and the stripline device and the multilayer wiring printed board 303 are electrically connected to each other by a lead frame 500, which acts as the first electrode leading terminal for connecting the valve metal 10 and the wire on the laminated printed board 303, and a second electrode leading terminal 520 provided on the metal plate 40.

The following will specifically describe the shapes of the first and second electrode leading terminals and the mounting positions thereof.

Figure 19:
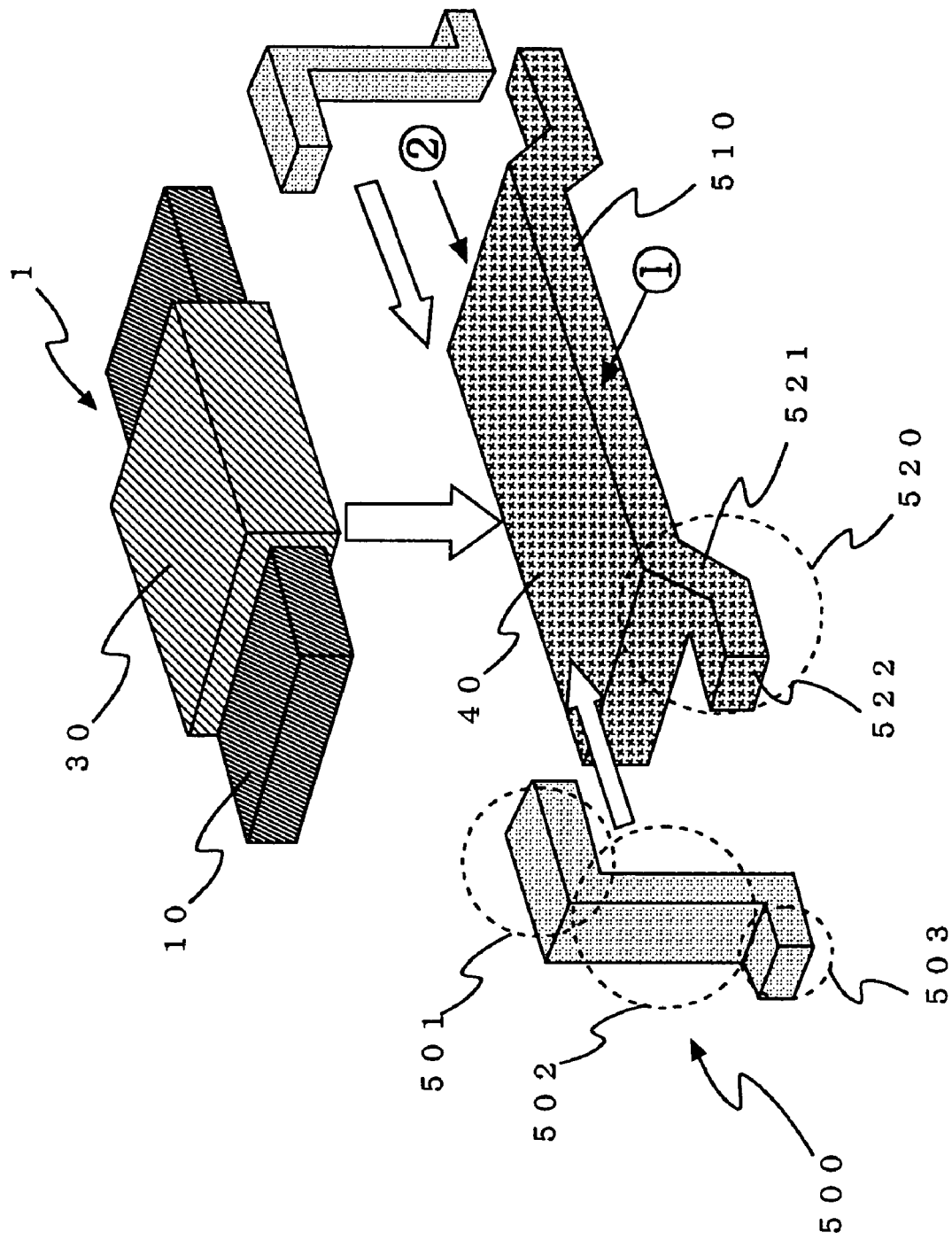
FIG. 19 is a diagram showing a first mode of an electrode leading terminal formed when the stripline device is mounted on the multilayer printed wiring board.

First, in a first mode of the electrode leading terminal, the lead frame 500 for electrically connecting the valve metal 10 and the multilayer printed wiring board 303 has, as shown in FIG. 19, a joint 501 for making connection to the valve metal 10, a first body 502 serving as the leg of the lead frame, and a first leg 503 for making connection to the wires on the multilayer printed wiring board. On both ends in the longitudinal direction of the first body 502, the joint 501 and the first leg 503 are mounted almost perpendicularly to the first body 502 so as to have opposite surfaces from each other with respect to the first body 502. Moreover, the metal plate 40 has the second electrode leading terminals 520 each of which is constituted of a second body 521 connected to a body 510 for mounting the stripline device and a second leg 522 connected to the wires on the multilayer printed wiring board. The pair of second bodies 521 connected to the body 510 of the metal plate 40 is disposed on both ends in the longitudinal direction of the metal plate 40 and disposed on the same long side of the top surface of the body 510 for mounting the stripline device. The second body 521 is not connected perpendicularly to the metal plate 40 but is mounted so as to be separated from the vertical direction to the longitudinal direction of the metal plate 40 with distance from the joint of the metal plate 40. That is, when the metal plate 40 is viewed as shown in FIG. 19 from the short side of the metal plate ((1) direction in FIG. 19), the metal plate 40 is mounted so as to be shaped like "八" by the pair of second bodies 521 as shown in FIG. 20. The second leg 522 is mounted on the second body 522 in parallel with the metal plate 40.

Figure 21:
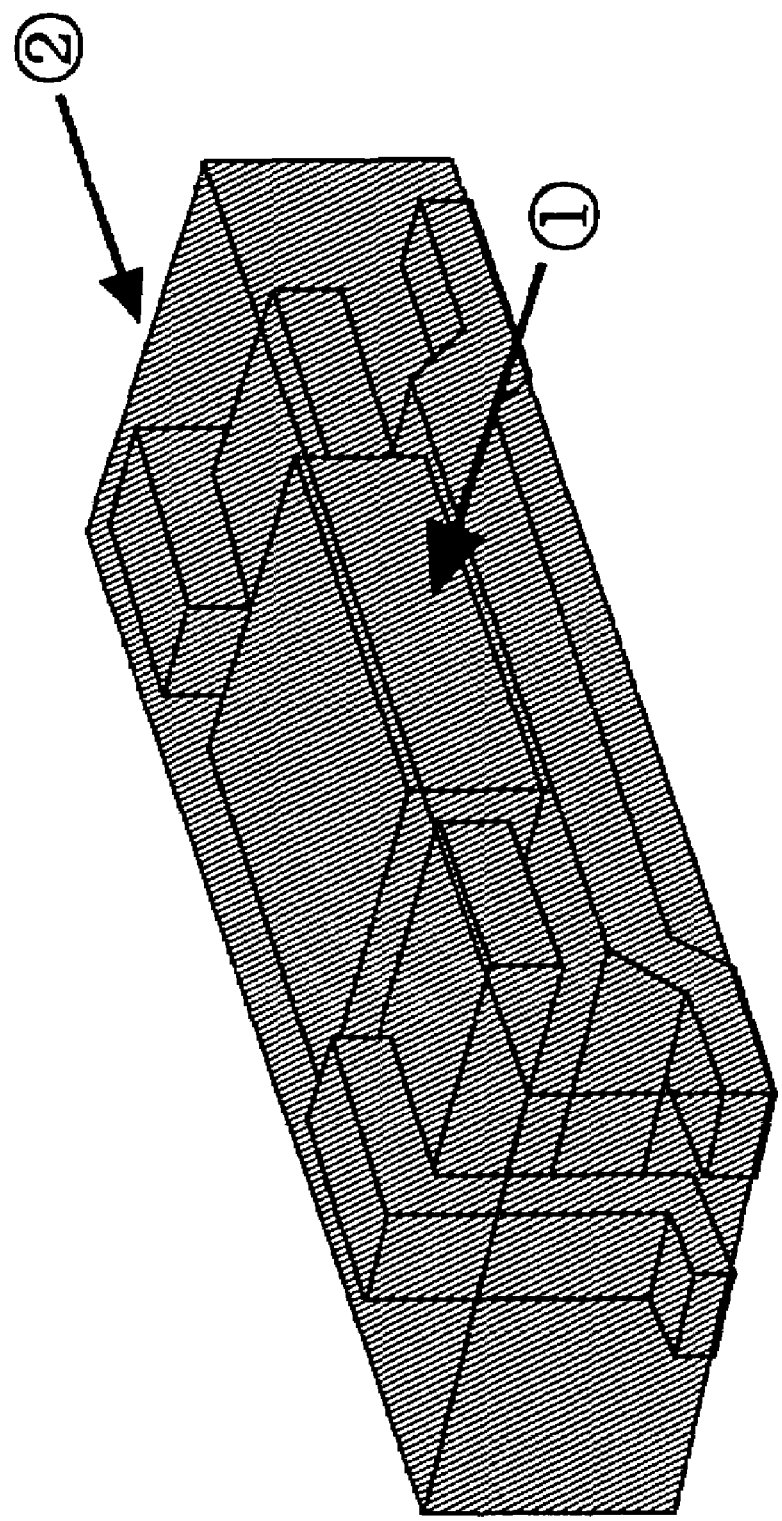
FIG. 21 is a diagram showing an external shape of the stripline device of FIG. 19 that has been molded with resin.

The stripline device is placed and bonded onto the metal plate 40 configured thus, the lead frame is bonded to the valve metal 10 on the other end in the longitudinal direction of the metal plate. The other end does not have the electrode leading terminals of the metal plate 40. The stripline device is mounted on the metal plate, and the lead frames 500 and the second electrode leading terminals 520 provided on the ends of the metal plate constitute the stripline device of a four-terminal structure. As shown in FIG. 21, the stripline device is molded with resin and is disposed on the printed wiring board. A diagonally shaded part shown in FIG. 21 indicates a molded part. The joints of the legs to be connected to the printed wiring board are all exposed from the bottom of a molded package. Further, the joint serving as the end of the leg has a larger area, that is, an area of the electrode leading terminal in contact with the printed wiring board is larger than a cross-sectional area of the electrode leading terminal not coming into contact with the printed wiring board. Thus, a contact area between the printed wiring board and the electrode leading terminal is increased, thereby preferably keeping an electrical contact. Moreover, it is possible to obtain preferred electrical characteristics (Ohmic characteristics) after a process such as solder reflow.

When the stripline device having the electrode leading terminal is pressed from above to the printed wiring board, the diagonally provided legs reduce a stress. FIG. 20 (A) is a side view showing the stripline device viewed from (1) direction of FIG. 19. FIG. 20(B) is a side view showing the stripline device viewed from (2) direction of FIG. 19. In the first embodiment, the legs 503 and 522 of the first electrode leading terminal 500 and the second electrode leading terminal 520 are widened to the outside. The legs may be narrowed to the inside (in the same direction as the first joint 501). With this configuration, it is possible to improve the packing density of devices on a circuit board.

Figure 22:
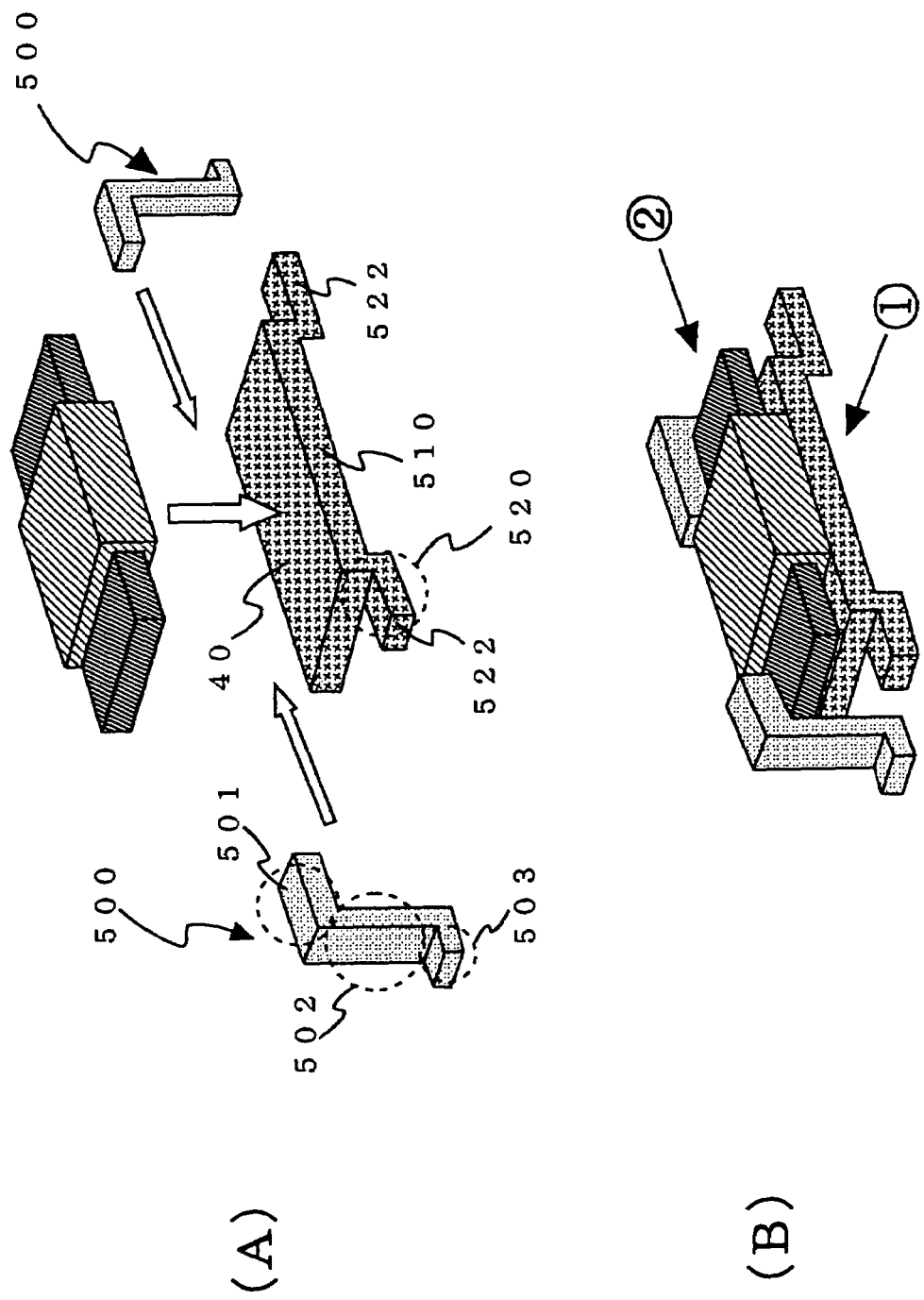
FIG. 22 is a diagram showing a second mode of the electrode leading terminal formed when the stripline device is mounted on the multilayer printed wiring board.

In a second mode of the electrode leading terminal, as shown in FIG. 22(A), the second legs 522 of the second electrode leading terminal 520 to be mounted on the metal plate 40 are directly connected to the body 510 of the metal plate 40. The second legs 522 are arranged in parallel along the longitudinal direction of the mounting surface of the metal plate 40 for mounting the stripline device. In the first embodiment, the second electrode leading terminals 520 are diagonally widened to the outside, whereas the second legs 522 are directly connected to the metal plate 40 in the present embodiment, so that a width to the outside is reduced and a packaging density is increased. Further, in the present embodiment, the legs to be in contact with the wires on the printed wiring board are disposed immediately under the metal plate 40 as much as possible, thereby improving the packaging density of a package. FIG. 23(A) is a side view showing the stripline device which has been molded in the state of FIG. 22(B) and is viewed in (1) direction of FIG. 22(B). FIG. 23(B) is a side view showing the stripline device which has been molded in the state of FIG. 22(B) and is viewed in (2) direction of FIG. 22(B). As shown in FIG. 23, in the present embodiment, the bottom of the leg is as high as the bottom of the mold or slightly higher (longer) than the mold, so that the design almost reaches the limit of the height direction. That is, the structure is made in consideration of a smaller thickness.

Figure 24:
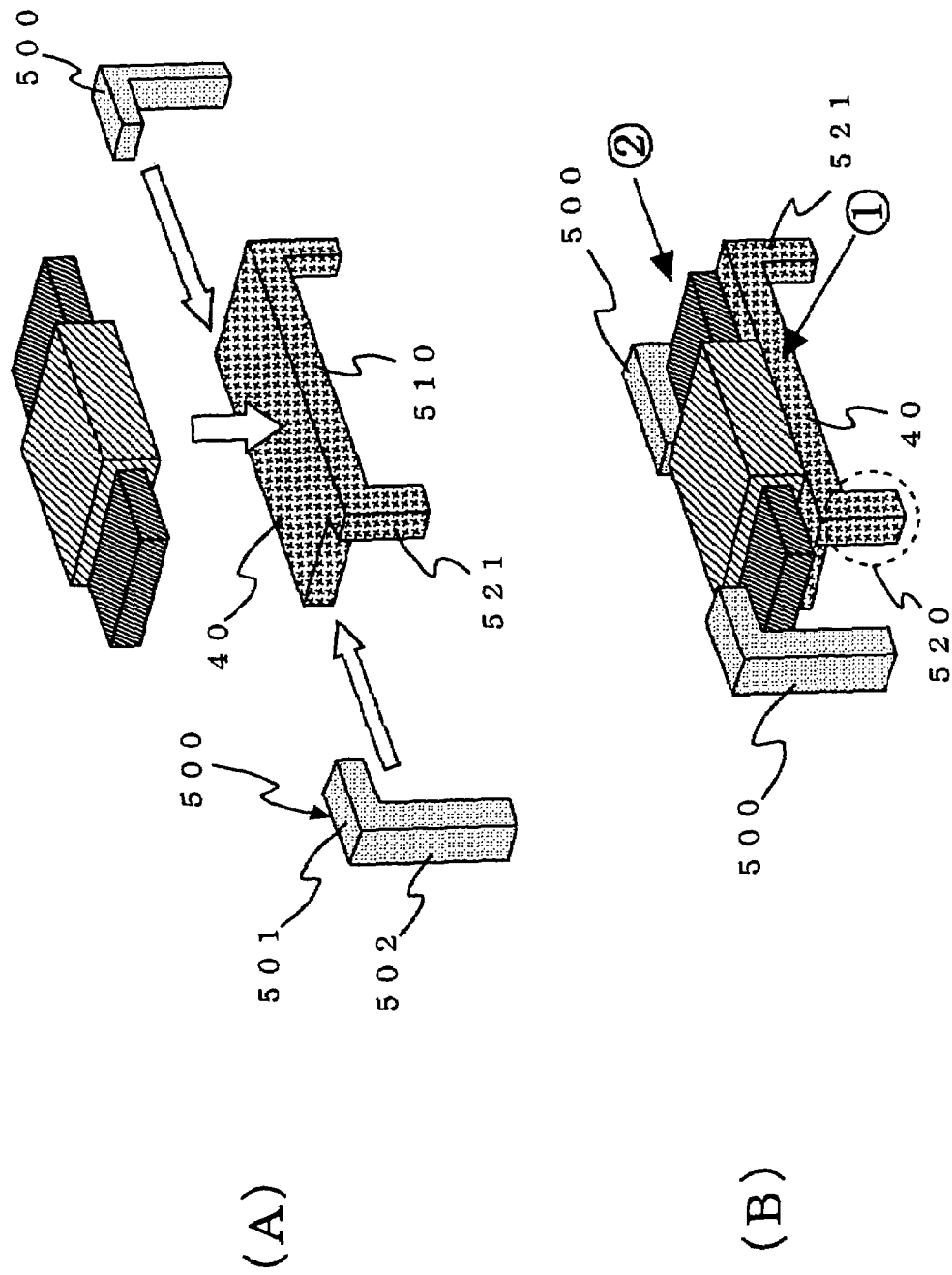
FIG. 24 is a diagram showing a third mode of the electrode leading terminal formed when the stripline device is mounted on the multilayer printed wiring board.
Figure 25:
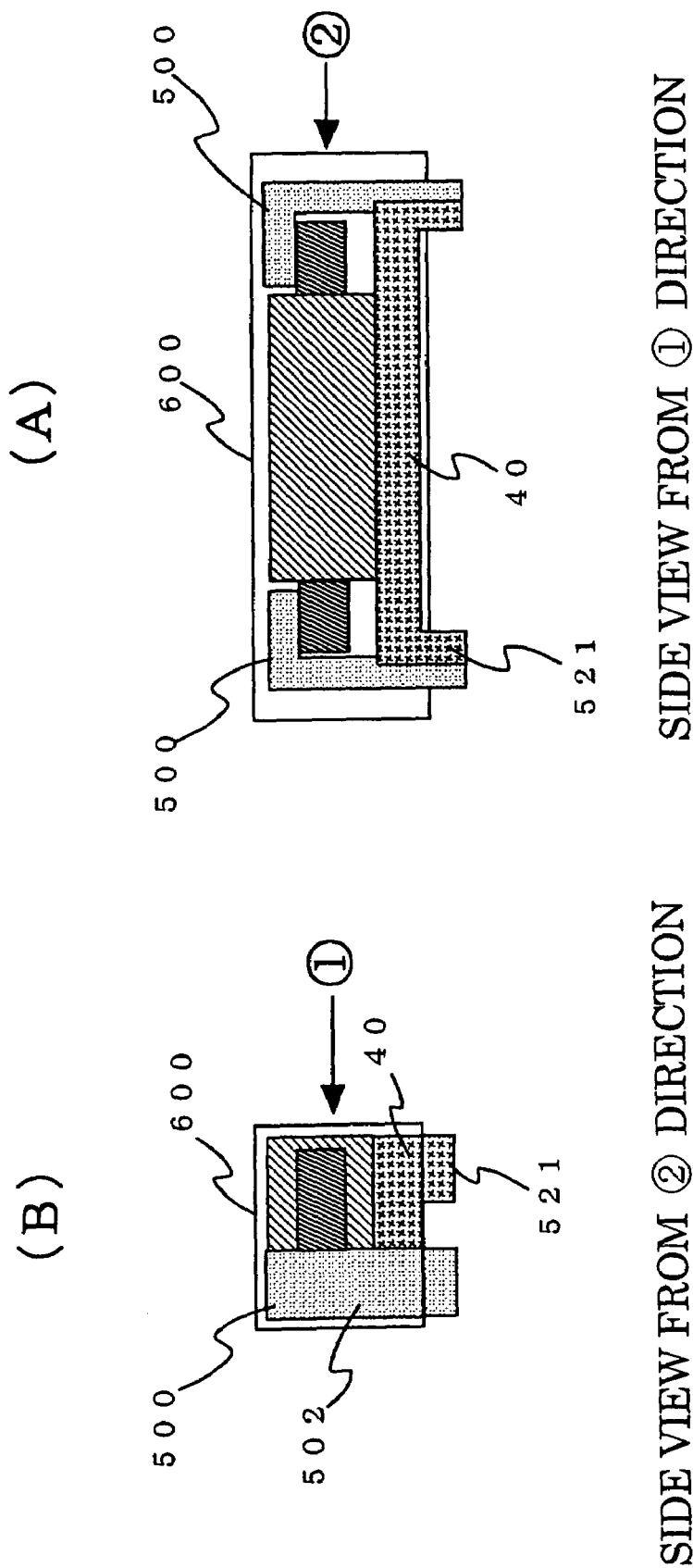
FIG. 25 is a side view showing the stripline device of FIG. 24 along the length direction and the width direction of the device.

A third mode of the electrode leading terminal will be discussed below. In the third mode, as shown in FIG. 24(A), the first bodies 502 and the second bodies 521 are mounted almost perpendicularly to the joints 501 and the metal plate 40. Further, the third mode does not have the legs 503 and 522 provided in the first mode of FIG. 19. This shape facilitates the formation of components and further reduces the area of the metal plate and the lead frame. Since the legs are removed, a width to the outside is reduced and a packaging density is increased. Further, in the present embodiment, the legs to be in contact with the wires on the printed wiring board are disposed immediately under the metal plate 40 as much as possible, thereby improving the packaging density of a package. FIG. 25(A) is a side view showing the stripline device which has been molded in the state of FIG. 24(B) and is viewed in (1) direction of FIG. 24(B). FIG. 25(B) is a side view showing the stripline device which has been molded in the state of FIG. 24(B) and is viewed in (2) direction of FIG. 24(B). As shown in FIG. 25, the bottom of the leg is as high as the bottom of the mold or slightly higher (longer) than the mold, so that the design almost reaches the limit of the height direction. That is, the structure is made in consideration of a smaller thickness.

Figure 26:
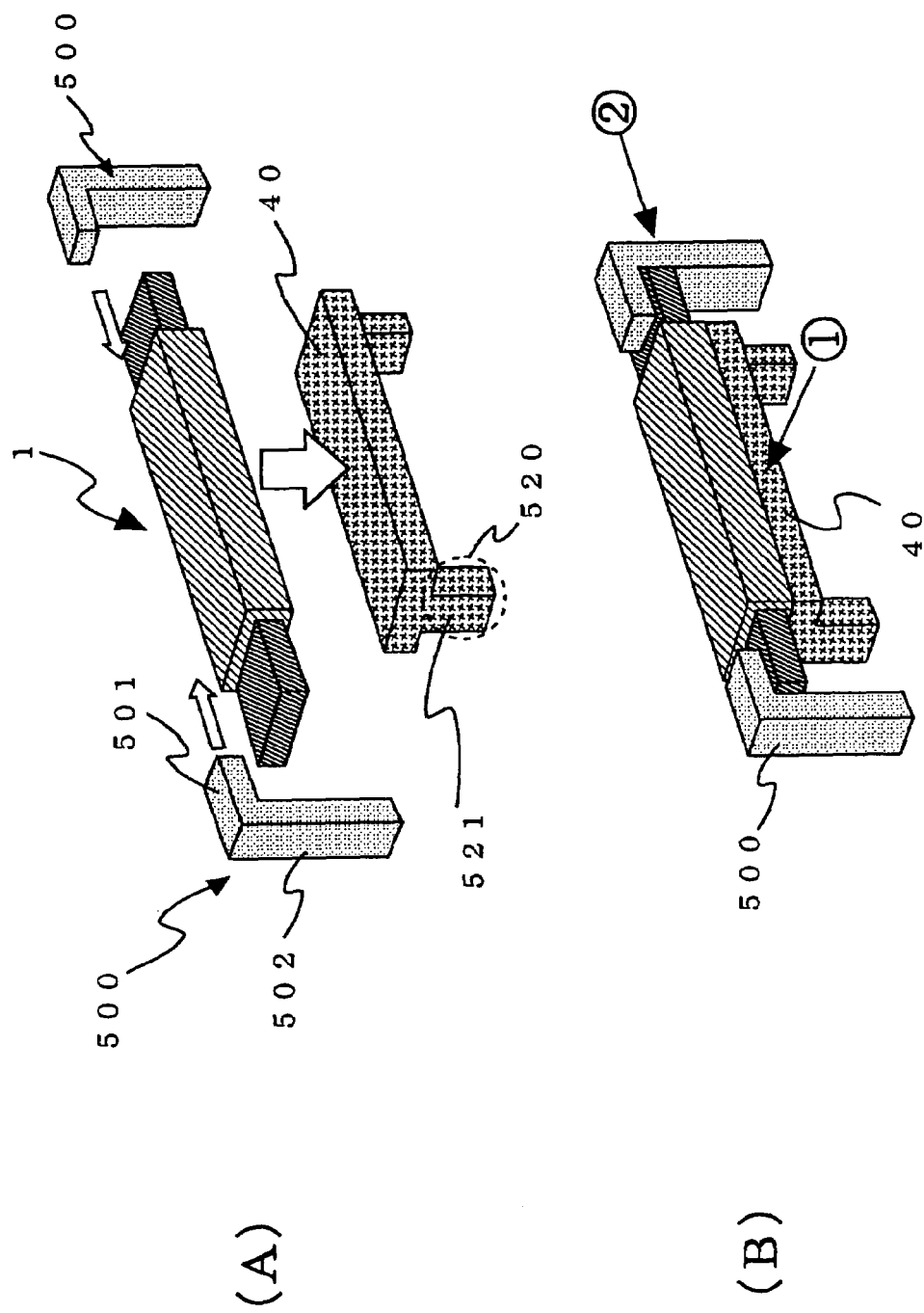
FIG. 26 is a diagram showing a fourth mode of the electrode leading terminal formed when the stripline device is mounted on the multilayer printed wiring board.
Figure 27:
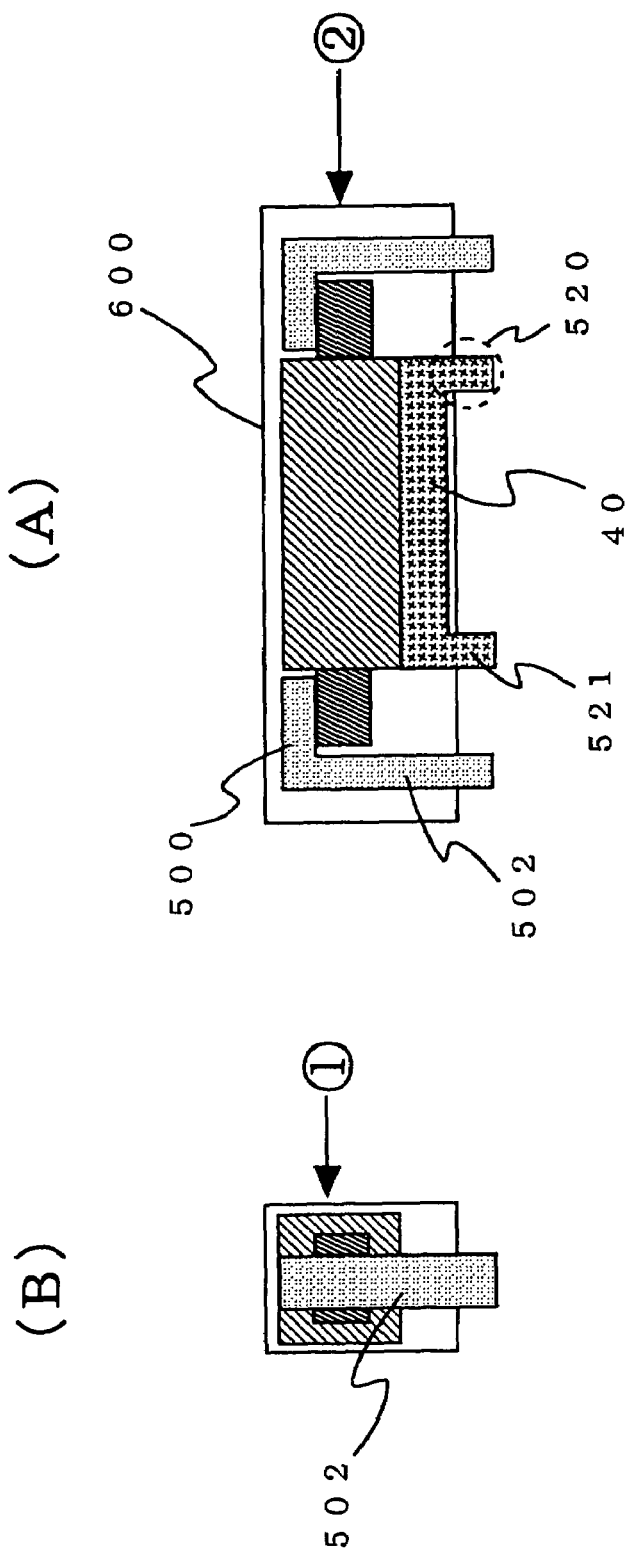
FIG. 27 is a side view showing the stripline device of FIG. 26 along the length direction and the width direction of the device.

A fourth mode of the electrode leading terminal will be discussed below. In the fourth mode, as shown in FIG. 26(A), the second body 521 of the second electrode leading terminal to be mounted on the metal plate 40 has legs disposed on both ends in the longitudinal direction of the metal plate and almost at the center of a short side of the mounting surface for mounting the stripline device. This mode can achieve a compact four-terminal stripline device with a small width. In this way, in the present embodiment, even when there is almost no area for mounting circuit elements on the board, an SIP (Single Inline Package) structure in which the stripline device is mounted so as to be vertically raised, thereby achieving high-density packaging. FIG. 27(A) is a side view showing the stripline device which has been molded in the state of FIG. 26(B) and is viewed in (1) direction of FIG. 26(B). FIG. 27(B) is a side view showing the stripline device which has been molded in the state of FIG. 26(B) and is viewed in (2) direction of FIG. 26(B).

The metal plate 40 and the lead frame, which are used for mounting the stripline device on the multilayer printed wiring board, are fabricated in steps discussed below, thereby simplifying the manufacturing process.

Figure 28:
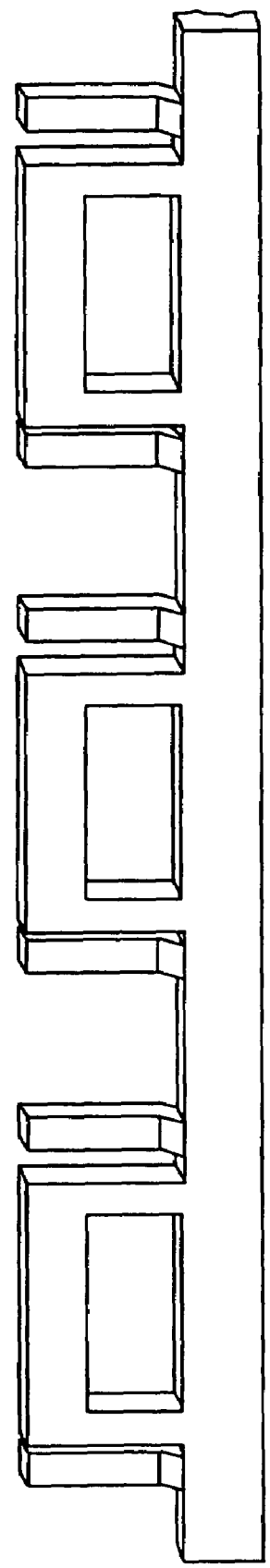
FIG. 28 is a diagram showing that a plurality of metal plates and lead frames are continuously connected on a substrate to form stripline devices.

As shown in FIG. 28, the metal plate is connected to the substrate by the legs disposed on both ends of the metal plate. As shown in FIG. 28, a plurality of metal plates are connected to the substrate. Moreover, on both ends in the longitudinal direction of the metal plate, the lead frames are disposed at regular intervals from the ends.

Figure 29:
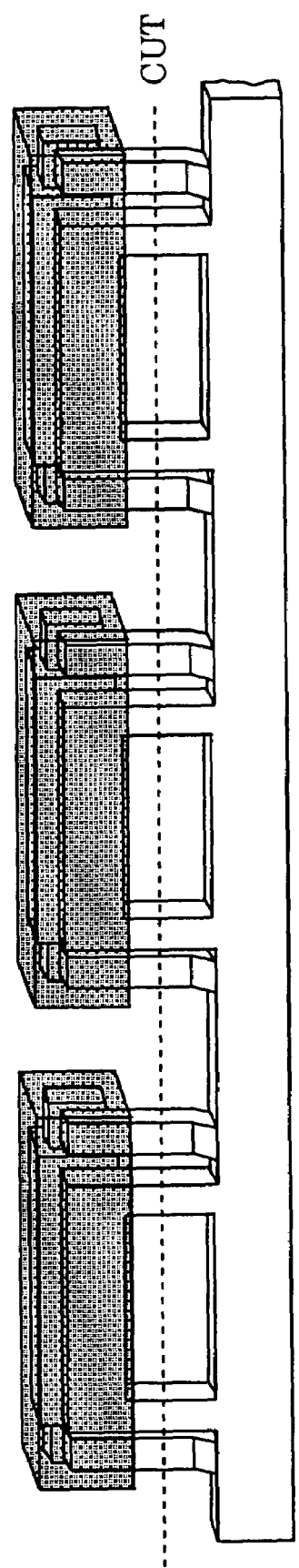
FIG. 29 is a diagram showing an external shape when the stripline devices are bonded on the substrate of FIG. 28 and are molded with resin.
Figure 30:
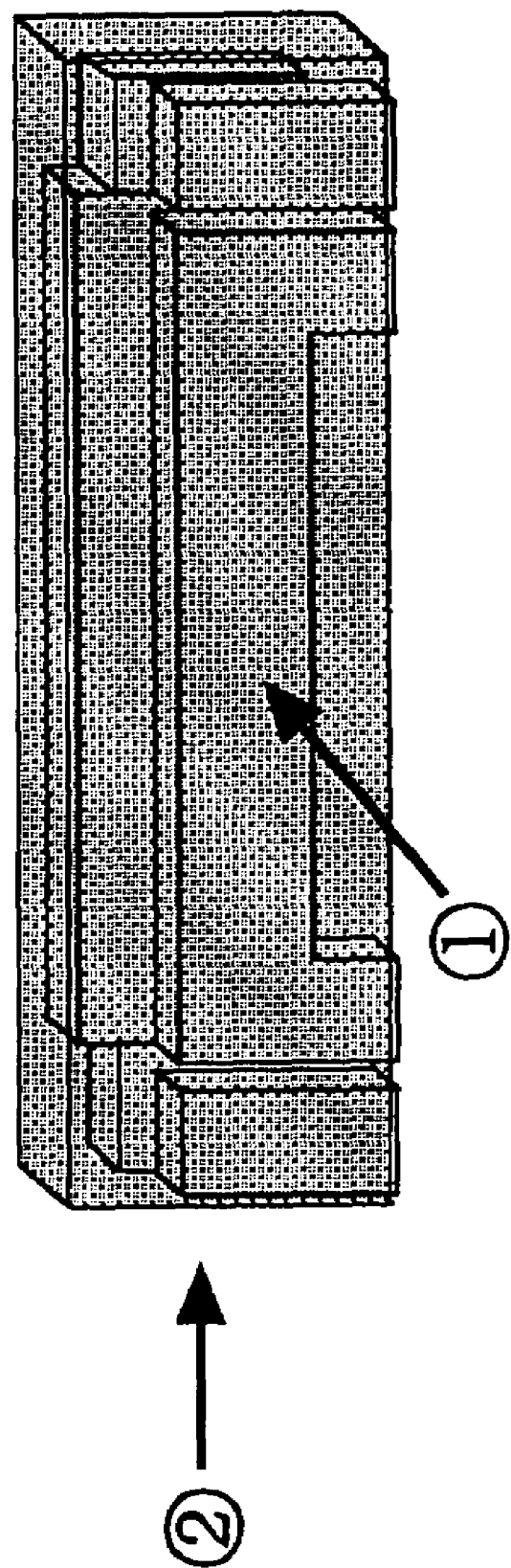
FIG. 30 is a diagram showing an external shape of the stripline device in which the metal plate and the lead frame are connected to each other and legs are cut at a predetermined length.

As shown in FIG. 29, the stripline device is bonded to the metal plate mounted on the substrate and the bonded stripline device is molded with resin. Then, the legs of the molded stripline device are cut at a predetermined length from the substrate, so that the stripline device of FIG. 30 is completed. After cutting, resin burrs are removed which have stuck to the surfaces of the electrode leading terminals 500 and 520 or gaps between the electrode leading terminals 500 and 520. A process of assembling semiconductors is applicable to these steps. In this way, the stripline devices are bonded to the substrate to which two or more groups of the metal plate 40 and the lead frame have been connected, and the legs of the electrode leading terminals are cut. Thus, it is possible to simplify the manufacturing process of the stripline device and increase mass productivity. FIG. 31(A) is a side view showing the stripline device which has been molded in the state of FIG. 30 and is viewed in (1) direction of FIG. 30. FIG. 31(B) is a side view showing the stripline device which has been molded in the state of FIG. 30 and is viewed in (2) direction of FIG. 30.

Figure 32:
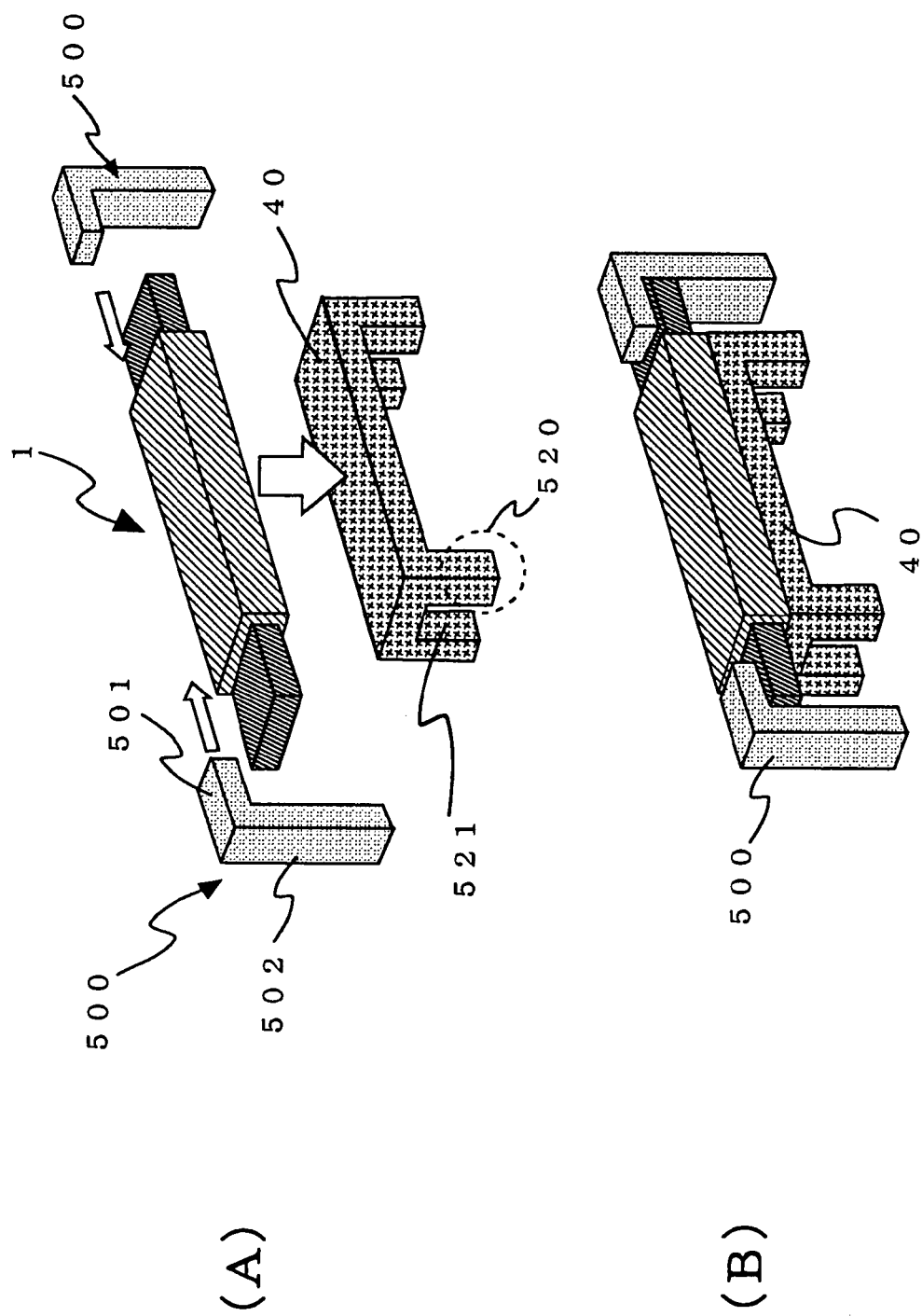
FIG. 32 is a diagram showing the configuration of a stripline device comprising a plurality of second electrode leading terminals.

The above explanation described an example in which the first and second electrode leading terminals are each disposed on both ends of the stripline device. The two or more electrode leading terminals 500 and 520 may be provided on both ends of the stripline device. For example, as shown in FIG. 32, the electrode leading terminals 500 may be provided respectively on both ends in the longitudinal direction of the valve metal, and the second bodies 521 of the second electrode leading terminals may be provided on both ends in the length and width directions (i.e., four corners) of the metal plate 40.

Figure 33:
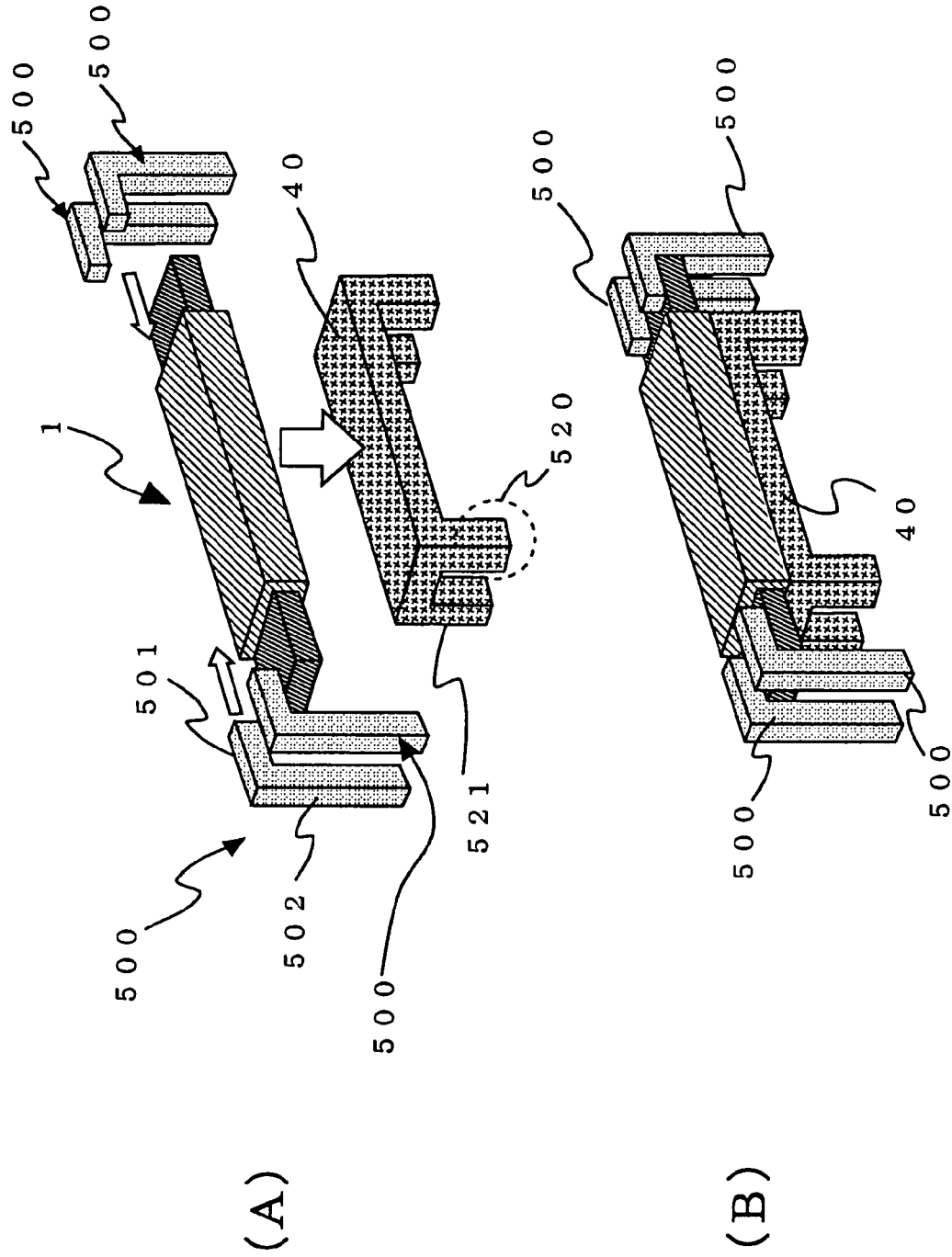
FIG. 33 is a diagram showing the configuration of a stripline device comprising a plurality of first and second electrode leading terminals.

Further, as shown in FIG. 33, the second bodies 521 of the second electrode leading terminals may be provided on the four corners of the metal plate 40, and the electrode leading terminals 500 may be provided on both ends of the length and width directions of the metal plate which constitutes the stripline device 1.

Figure 34:
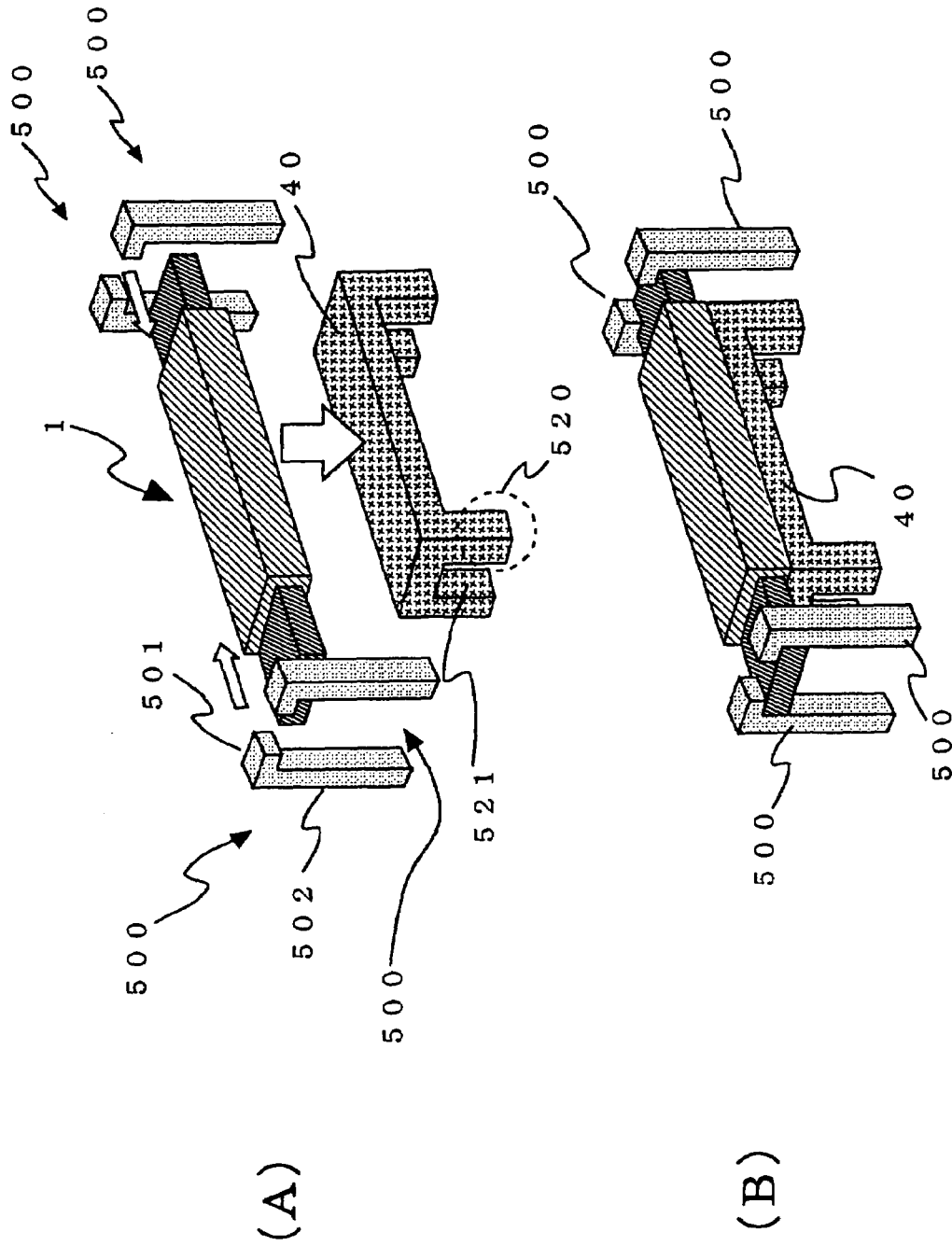
FIG. 34 is a diagram showing the configuration of a stripline device having the first electrode leading terminals drawn in the width direction.
Figure 35:
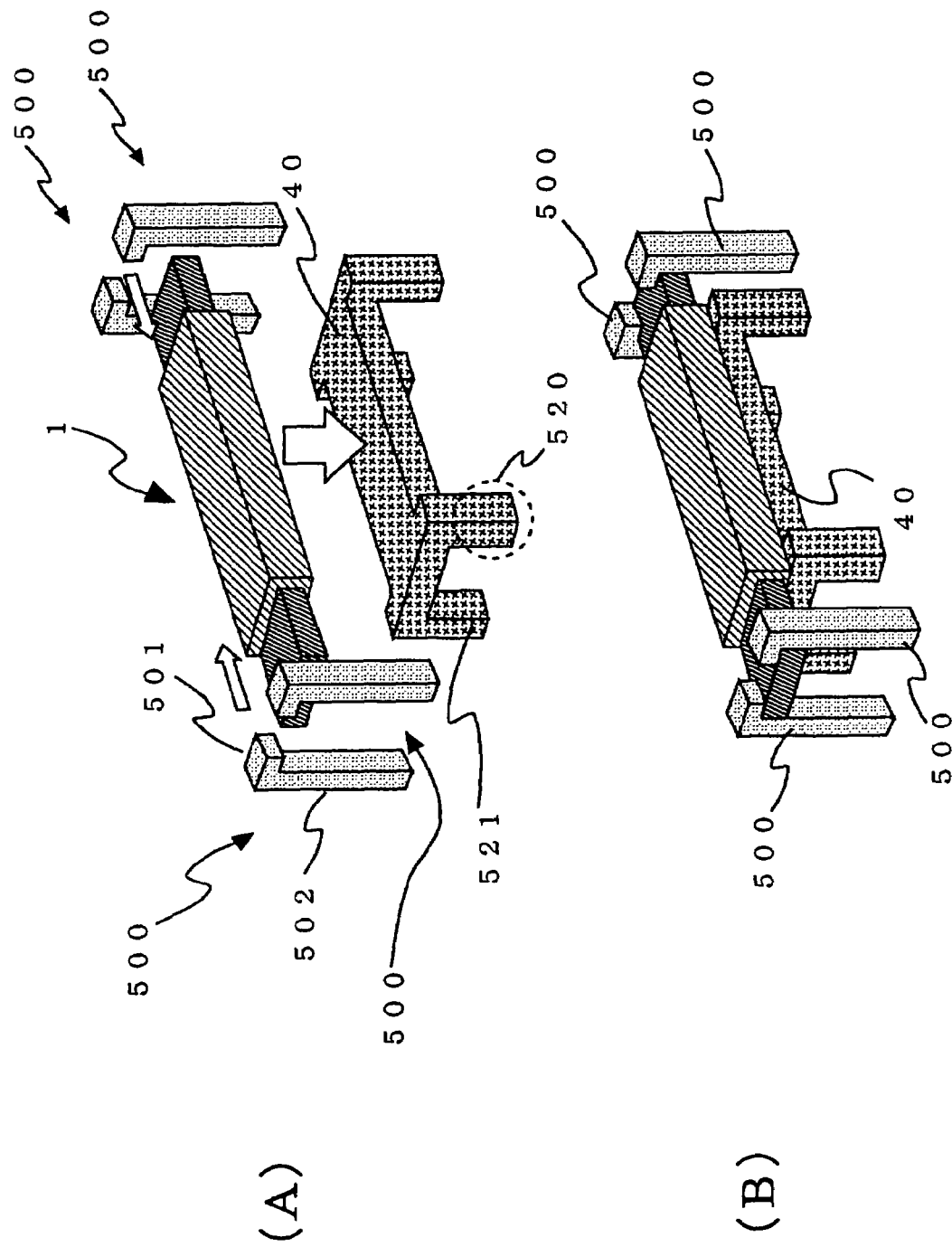
FIG. 35 is a diagram showing the configuration of a stripline device having the first and second electrode leading terminals drawn in the width direction.

As shown in FIGS. 34 and 35, when the two or more electrode leading terminals are provided, the electrode leading terminals may be disposed so as to protrude in the cross direction (width direction) of the stripline device. The electrode leading terminals are disposed in the cross direction of the stripline device, thereby improving a packaging strength for the board. The above explanation described some structures in which the two electrode leading terminals are disposed on the ends of the stripline device. Needless to say, three or more electrode leading terminals may be disposed.

Further, the above explanation described the examples in which lines in the stripline device are mounted in parallel with the board. By changing the shapes of the first and second electrode leading terminals 500 and 520, the present embodiment is also applicable to a configuration where lines in the stripline device are mounted perpendicularly to the board (that is, vertically mounted).

Besides, the above explanation described the configuration where the stripline devices of the first to thirteenth embodiments are mounted on the metal plate 40 and then is mounted on the printed wiring board 303. The stripline device to be mounted is not limited to the above as long as the stripline device is a low-impedance stripline device characterized as below:

(1) A length sufficiently considered to be a line as viewed from electromagnetic waves in a frequency band to be subjected to decoupling (a part permitting the passage of electromagnetic waves preferably has a substantial length (=an effective line length) which is equal to or larger than a quarter of the wavelength of an electromagnetic wave at a target frequency).

(2) A sufficiently low impedance of a line device relative to a high frequency as viewed from a circuit for generating electromagnetic waves.

Regarding (1), it can be said that a transmission line generally has a constant characteristic impedance over a wide frequency range. Formula (1) indicates a characteristic impedance Zy of the stripline device. In an area where a resistance R and a conductance G are negligible, the characteristic impedance is determined by L and C regardless of a frequency. Thus, by designing a transmission line having a low inductance L per unit length and a large capacitance C per unit length, it is possible to achieve a device which has a low characteristic impedance with low dependence on frequencies over a wide frequency range.

$$Zy = \sqrt{\frac{R+j\omega L}{G+j\omega C}} \approx \sqrt{\frac{L}{C}} \quad (1)$$

Figure 36:
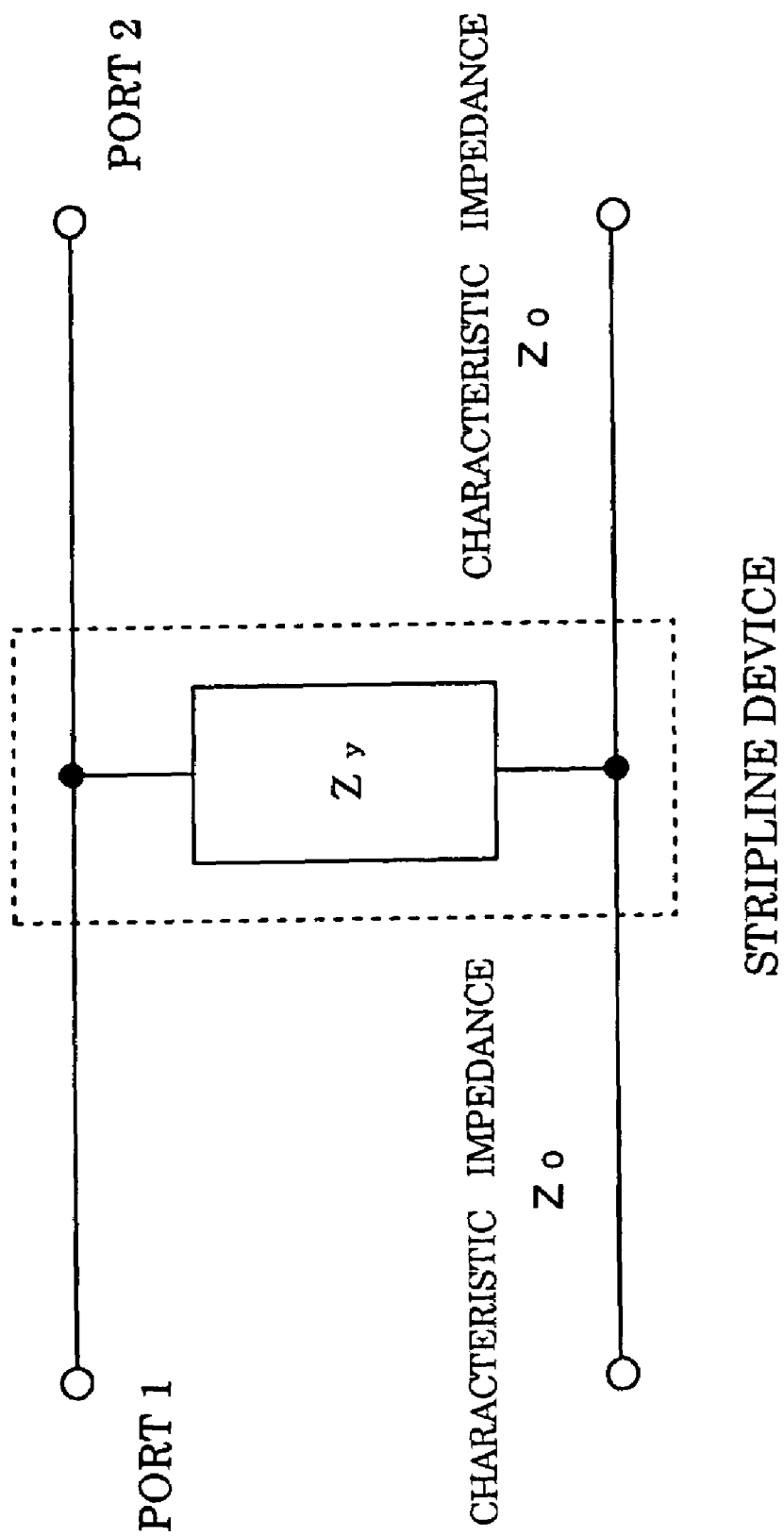
FIG. 36 is an equivalent circuit diagram for calculating a reflection coefficient $\Gamma$ and a transmission coefficient T on a line.

The characteristic (2) will be examined below. As shown in FIG. 36, the impedance of the line device can be evaluated by a circuit having a constant characteristic impedance of Z0. As shown in FIG. 36, the characteristic of the line device is indicated by a transmission property from a port 1 to a port 2. A reflection coefficient F and a transmission coefficient T for evaluating the circuit are factors S11 and S21 of a scattering matrix [S] and are expressed by the formula below:

$$[S] = \frac{1}{2\hat{Z}_y + 1}\begin{bmatrix} -1 & 2\hat{Z}_y \\ 2\hat{Z}_y & -1 \end{bmatrix} \quad (2)$$

$$\text{where, } \hat{Z}_y = \frac{Z_y}{Z_0}$$

where Z0 represents a characteristic impedance of an input/output line of the line device and Zy represents an impedance of the line device. Therefore, in the case of Z0>>Zy, Γ≈−1 and T≈0 are established and a high frequency electromagnetic wave to be inputted can be reflected around the entrance of the transmission line.

As described above, the characteristic impedance of the line is calculated by $(L/C)^{1/2}$ and thus is determined only by a capacitance component and an inductance component. Since the characteristic impedance has a constant value relative to a frequency, the decoupling property is not theoretically degraded by a frequency.

Figure 37:
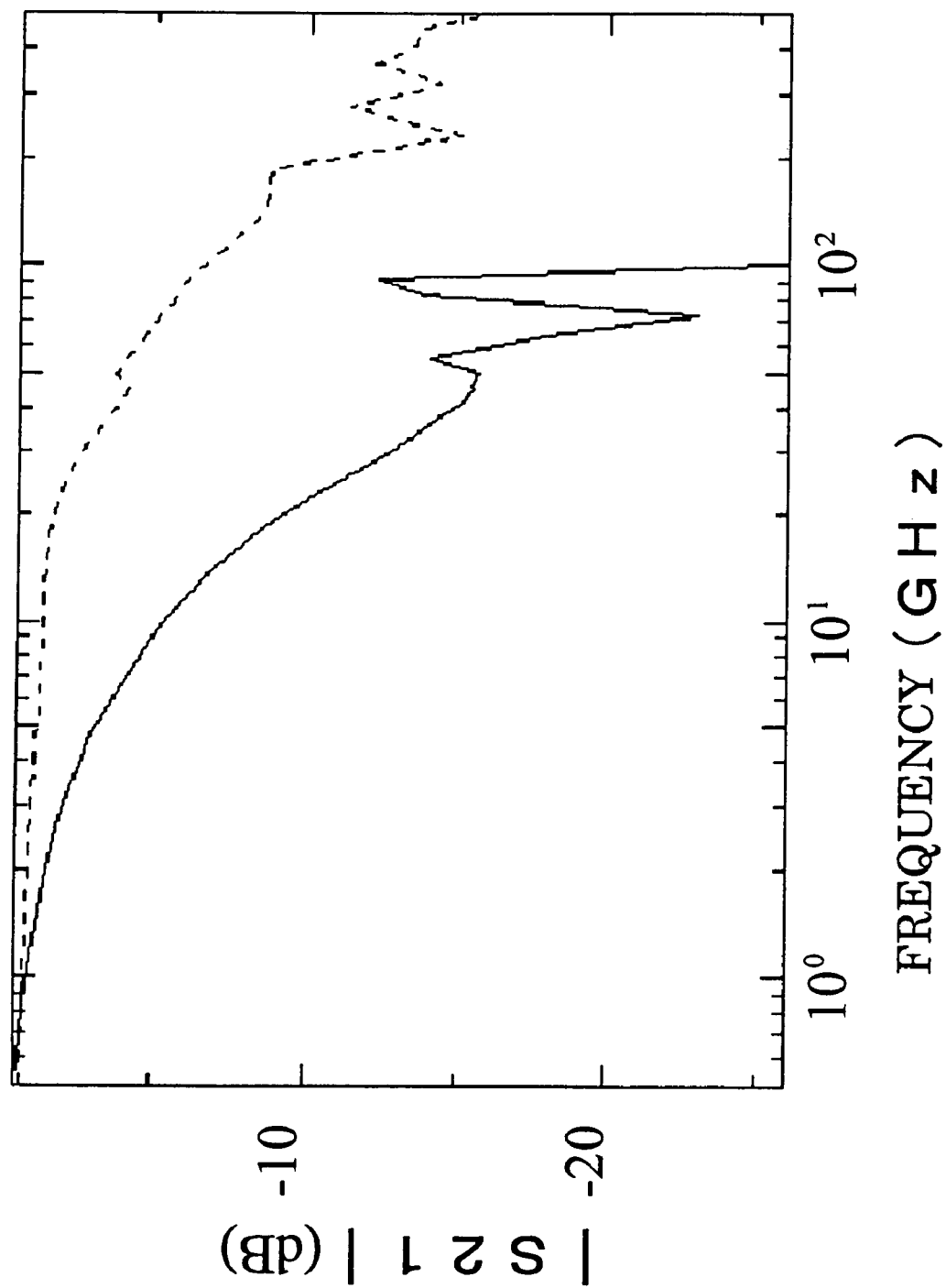
FIG. 37 is a diagram showing the relationship between a frequency and a transmittance of a decoupling device.

FIG. 37 shows the factor S21 (see Formula (4)) of the sequence [S] indicating the transmission coefficient T of a decoupling device. In other words, FIG. 37 is a diagram showing the relationship between a frequency and a transmittance of the decoupling device. In FIG. 37, a broken line indicates a transmission coefficient when a capacitor is connected to a line of a power distribution circuit and is caused to act as a decoupling device. A solid line indicates a transmission coefficient when a line of the power distribution circuit is caused to have a wiring capacitance and act as a decoupling device. The vertical axis represents a transmittance (dB) and the horizontal axis represents a frequency (GHz).

When a comparison is made between a transmittance when the capacitor is connected to the line of the power distribution circuit and a transmission when the line of the power distribution circuit is caused to have a wiring capacitance, a transmission is smaller when the line is caused to have a wiring capacitance (that is, a cutting rate is high), thereby achieving an excellent decoupling property.

In this way, unlike the decoupling of the power distribution circuit that is conventionally performed using a capacitor, decoupling can be performed by providing a line structure and inserting a device in which an L (inductance), a C (capacitance), and an R (resistance) are set at proper values and a line has a decoupling property.

Parameters for obtaining a desired decoupling property include L, C, and R. When L and R increase, a problem occurs which includes great fluctuations in power supply voltage during the switching of a logic circuit. Thus, it is necessary to adjust the decoupling property by adjusting C.

The following will describe a configuration when the stripline devices of the first to thirteenth embodiments are mounted on a semiconductor package.

Figure 38:
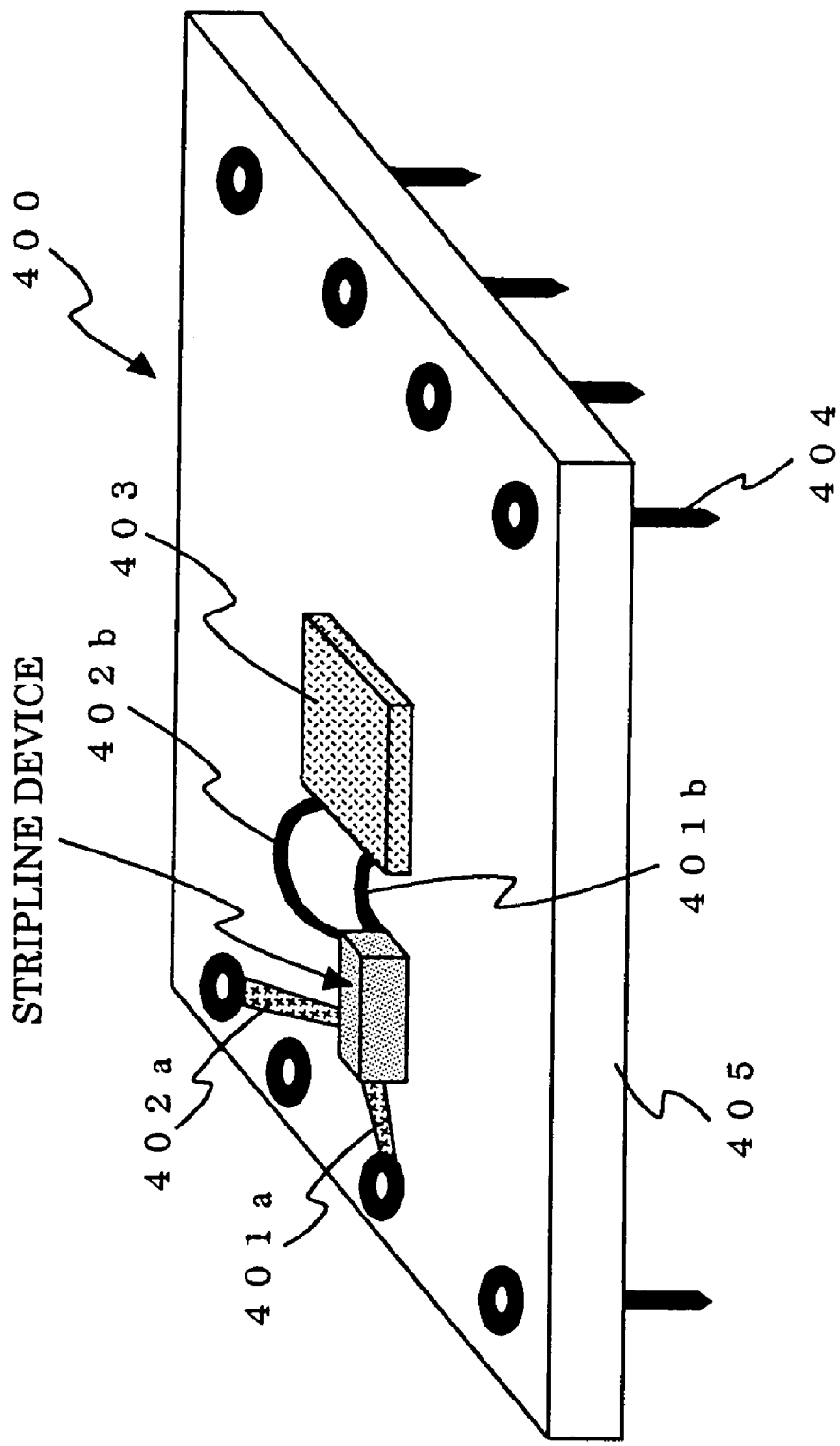
FIG. 38 is a perspective view showing that the stripline device of the present invention is mounted on a semiconductor package.

As shown in FIG. 38, the stripline device and a semiconductor chip 403 are arranged on a substrate 405 made of an insulating material. The stripline devices of the first to thirteenth embodiments are disposed between a power supply wire 401b and a ground wire 402b of the semiconductor chip and a power supply wire 401a and a ground wire 402a of connector pins provided on the substrate 405. The power supply wire 401b of the semiconductor chip and the power supply wire 401a of the connector pin are connected to the anode leading terminals 11 and 12 of the stripline device. The ground wire 402b of the semiconductor chip and the ground wire 402a of the connector pin are connected to the cathode leading terminals 41 and 42 of the stripline device.

High frequency noise from the semiconductor chip 403 mounted on the substrate 405 is superimposed on the power supply wire 401b and the ground wire 402b, propagates through these wires, and causes circuit elements to malfunction. By filtering the noise in the stripline device included in the semiconductor package, a malfunction caused by high frequency noise is less likely to occur on a semiconductor device of FIG. 38, thereby achieving stable circuit operations at high frequencies. The above explanation described that a wire paired with the power supply wire is the ground wire. A negative power supply wire may be paired with the power supply wire.

The above-described embodiments are preferred embodiments of the present invention. The embodiments are not limited to the above and various changes can be made within the scope of the present invention.

INDUSTRIAL APPLICABILITY

As described above, according to the present invention, a stripline device is constituted of a valve metal having a dielectric coating, a conductive material layer disposed around the valve metal via the dielectric coating, a pair of electrode leading terminals disposed on different positions of the valve metal, and a pair of electrode leading terminals disposed on different positions of the conductive material layer. This configuration increases an apparent dielectric loss and thus the characteristic impedance of the stripline device can be sufficiently reduced, thereby preventing an electromagnetic wave generated from a noise source from entering a power distribution circuit.

Further, when a long metal with a length larger than a cross sectional dimension by four times or more is used as the valve metal, a noise reduction effect can be exerted more effectively.

Moreover, both ends of the valve metal are bent or curved in one direction. Thus, only by dipping into a solution for anodization or a solution for forming a layer of a conductive material, it is possible to readily manufacture the stripline device and readily obtain a shape for performing packaging while avoiding other components.

A substrate and the stripline devices are positioned and bonded to each other such that the conductive material layers and metal members are in contact with each other and lead frames and the valve metals are in contact with each other. On the substrate, the plurality of metal members having first electrode leading terminals and the plurality of lead frames serving as second electrode leading terminals are integrally formed, and the stripline devices are obtained in a process before the formation of the conductive material layers. The first electrode leading terminals and the lead frames are cut from the substrate at a predetermined distance, so that the stripline device is obtained. These steps make it possible to readily manufacture the stripline device of a four-terminal structure.

The invention claimed is:

1. A stripline device, comprising:
   a metal having a valve action;
   a dielectric coating formed on a surface of the metal having the valve action;
   a conductive material layer formed around the metal having the valve action via the dielectric coating;
   a metal member attached to the conductive material layer;
   a pair of first electrode leading terminals provided on both ends in a longitudinal direction of the metal having the valve action to make connection to through holes of a printed wiring board; and
   a pair of second electrode leading terminals provided on different positions of the metal member to make connection to the through holes of the printed wiring board.

2. The stripline device according to claim 1, wherein the metal having the valve action is rectangular in cross section.

3. The stripline device according to claim 1, wherein the metal having the valve action is circular or oval in cross section.

4. The stripline device according to claim 1, wherein the metal having the valve action is shaped like a ring in cross section.

5. The stripline device according to claim 1, wherein the metal having the valve action is formed into a plate or foil.

6. The stripline device according to claim 1, wherein both ends of the stripline device are bent or curved.

7. The stripline device according to claim 1, wherein the metal having the valve action has a longitudinal width larger than a cross sectional width.

8. The stripline device according to claim 1, wherein one of the first and second electrode leading terminals in contact with the printed wiring board has an area larger than a cross-sectional area of the another of the first and second electrode leading terminals not coming into contact with the printed wiring board.

9. The stripline device according to claim 1, wherein the conductive material layer includes a layer of a conducting polymer.

10. The stripline device according to claim 9, wherein the conducting polymer is one or more compounds selected from the group consisting of polypyrrole, polythiophene, and polyaniline, or a derivative of the compounds.

11. The stripline device according to claim 9, wherein the conductive material layer has the conducting polymer layer disposed on a side of the dielectric coating and a conductive paste layer formed on the conducting polymer layer.

12. The stripline device according to claim 11, wherein the metal member is fixed on the conductive paste layer.

13. The stripline device according to claim 1, wherein the metal having the valve action is a metal selected from the group consisting of aluminum, tantalum, and niobium.

14. The stripline device according to claim 1, wherein the metal having the valve action, the dielectric coating, and the conductive material layer are molded with resin.

15. A stripline device, comprising:
a metal having a valve action,
a dielectric coating formed on a surface of the metal,
a conductive material layer formed around the metal via the dielectric coating, and
a metal member which is disposed in contact with the conductive material layer and transmits direct-current power, wherein:
the stripline device includes a first electrode leading terminals for connecting an end of the metal having the valve action and a printed wiring board;
second electrode leading terminals connected to the printed wiring board are integrally formed on the metal member; and
the second electrode leading terminals and the first electrode leading terminals connected to both ends of the metal having the valve action form four terminals.

16. The stripline device according to claim 15, wherein:
the first electrode leading terminal includes:
a connecting member connected to the metal having the valve action;
a first leg member connected to a wire on the printed wiring board; and
a first body member for connecting the connecting member and the leg member;
the connecting member and the first leg member are connected almost perpendicularly to both ends in a longitudinal direction of the first body member;
each second electrode leading terminal integrally formed on the metal member includes:
a second body member; and
a second leg member for making connection to another wire on the printed wiring board;

the second body member is connected to an upper end of a mounting surface of both ends in a longitudinal direction of the metal member; and
the second leg member is connected to the body member almost in parallel with the mounting surface.

17. The stripline device according to any one of claim 16, wherein the first leg member and the second leg member have a cross sectional area larger than a cross sectional area of the first body member and the second body member not coming into contact with the printed wiring board.

18. The stripline device according to claim 15, wherein:
the first electrode leading terminal includes:
a connecting member connected to the metal having the valve action;
a first leg member connected to a wire on the printed wiring board; and
a first body member for connecting the connecting member and the leg member;
a member is provided to interpose the first body member between the connecting member connected to the first body member and the first leg member on both ends in a longitudinal direction of the first body member and connect the connecting member and the first leg member almost perpendicularly to the first body member; and
the second electrode leading terminals include second leg members connected to both ends in a longitudinal direction of the metal member and near one of long sides of the metal member almost in parallel with the mounting surface.

19. The stripline device according to claim 15, wherein:
the first electrode leading terminal includes:
a connecting member connected to the metal having the valve action; and
a first body member connected to a wire on the printed wiring board;
the connecting member is connected to an end in a longitudinal direction of the first body member almost perpendicularly to the first body member; and
each second electrode leading terminal includes a second body member connected almost perpendicularly to a vicinity of one of long sides of both ends in a longitudinal direction of the metal member.

20. The stripline device according to claim 15, wherein:
the first electrode leading terminal includes:
a connecting member connected to the metal having the valve action; and
a first body member connected to a wire on the printed wiring board;
the connecting member is connected to an end in a longitudinal direction of the first body member almost perpendicularly to the first body member;
each second electrode leading terminal includes a second body member connected almost perpendicularly to a central area near both ends in a longitudinal direction of a mounting surface of the metal member; and
the first electrode leading terminal and the second electrode leading terminal are disposed almost in line with each other in the longitudinal direction of the mounting surface of the metal member.

21. A method of forming a stripline device, comprising the steps of:
forming a metal having a valve action;
forming a dielectric coating on a surface of the metal having the valve action;

forming a conductive material layer around the metal having the valve action via the dielectric coating to form a strip line;

bonding the strip line and a plurality of substrates, on which a metal member having a second electrode leading terminal and a lead frame serving as a first electrode leading terminal are integrally formed, after performing positioning such that the conductive material layer and the metal member are in contact with each other and the lead frame and the metal having the valve action are in contact with each other; and cutting the second electrode leading terminal and the lead frame from the substrate at a predetermined distance to complete a stripline device.

* * * * *